United States Patent
Koizumi et al.

(10) Patent No.: US 8,120,166 B2
(45) Date of Patent: Feb. 21, 2012

(54) SEMICONDUCTOR PACKAGE AND METHOD OF MANUFACTURING THE SAME, AND SEMICONDUCTOR DEVICE AND METHOD OF MANUFACTURING THE SAME

(75) Inventors: Naoyuki Koizumi, Nagano (JP); Akihiko Tateiwa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 169 days.

(21) Appl. No.: 12/512,277

(22) Filed: Jul. 30, 2009

(65) Prior Publication Data
US 2010/0052153 A1  Mar. 4, 2010

(30) Foreign Application Priority Data

Aug. 26, 2008  (JP) .................................. 2008-216325
Sep. 22, 2008  (JP) .................................. 2008-242066

(51) Int. Cl.
*H01L 23/538* (2006.01)

(52) U.S. Cl. ................. 257/697; 257/692; 257/E23.169

(58) Field of Classification Search .................. 257/697, 257/E23.169, E23.499, 692; 438/123
See application file for complete search history.

(56) References Cited

U.S. PATENT DOCUMENTS

2009/0211798 A1 * 8/2009 Horiuchi et al. .............. 174/262

FOREIGN PATENT DOCUMENTS

| JP | 1-100958 | 4/1989 |
| JP | 2000-58736 | 2/2000 |
| JP | 2001-148441 A1 | 5/2001 |

* cited by examiner

*Primary Examiner* — Roy Potter
(74) *Attorney, Agent, or Firm* — Kratz, Quintos & Hanson, LLP

(57) ABSTRACT

A semiconductor package of the present invention, includes a wiring substrate, a lead pin fixed to a connection pad on one surface side of the wiring substrate by solder, and a reinforcing resin layer formed on a surface of the wiring substrate on which the lead pin is provided and having a projection-shaped resin portion which projects locally around the lead pin and covers a side surface of a base portion side of the lead pin. The projection-shaped resin portion has a top surface extending from an outer peripheral portion of the lead pin to an outside, and a side surface constituting a non-identical surface to the top surface.

9 Claims, 18 Drawing Sheets

(fragmental enlarged view)

(fragmental enlarged view)

SEMICONDUCTOR PACKAGE AND METHOD OF MANUFACTURING THE SAME, AND SEMICONDUCTOR DEVICE AND METHOD OF MANUFACTURING THE SAME

CROSS-REFERENCE TO RELATED APPLICATIONS

This application is based on and claims priority of Japanese Patent Application No. 2008-216325 filed on Aug. 26, 2008, and Japanese Patent Application No. 2008-242066 filed on Sep. 22, 2008, the entire contents of which are incorporated herein by reference.

BACKGROUND OF THE INVENTION

1. Field of the Invention

The present invention relates to a semiconductor package and a method of manufacturing the same and a semiconductor device and a method of manufacturing the same and, more particularly, a semiconductor package in which lead pins are fitted to a wiring substrate as connection terminals and a method of manufacturing the same and a semiconductor device and a method of manufacturing the same.

2. Description of the Related Art

In the prior art, there is a semiconductor package having such a structure that lead pins are fitted to a wiring substrate as connection terminals. In such semiconductor package, a semiconductor chip is mounted on the opposite side to the lead pin side of the wiring substrate, and the lead pins are inserted into sockets, or the like of a mounting substrate and are connected thereto.

In Patent Literature 1 (Patent Application Publication (KOKAI) Hei-1-100958), it is set forth that, in a ceramic wiring substrate to which input/output pins are fitted, a resin whose thermal expansion coefficient is substantially equal to the ceramic is coated on a pin-side surface of the ceramic wiring substrate, so that an adhesive strength of the input/output pins is reinforced.

Also, in Patent Literature 2 (Patent Application Publication (KOKAI) 2001-148441), it is set forth that lead pins are fixed to lands of a circuit substrate by solder, then a resin body in which an insertion portion is provided is fitted on the lead pins, and then soldering portions of base portion of the lead pins are coated with the resin by heating the resin body, so that a fitting strength of the lead pins is increased.

Also, in Patent Literature 3 (Patent Application Publication (KOKAI) 2000-58736), it is set forth that terminal pins are fixed to wiring pad portions of a resin substrate by the soldering, then a reinforcing sheet in which pin through holes are provided is positioned in close vicinity to an outer surface of the resin substrate, and then an adhesive resin is poured into a resin filling space of narrow width between the reinforcing sheet and the resin substrate, so that the terminal pins are fixed to the resin substrate certainly.

In above Patent Literatures 1 to 3, the fitting strength of the lead pins is reinforced by forming the resin on the base portions of the lead pins which are fitted to the wiring substrate. In this case, a further increase of the fitting strength of the lead pins is requested.

Also, as explained in the column of the related art described later, the lead pins are fixed to the lower surface side of the wiring substrate with the solder, and then the semiconductor chip is mounted on the upper surface side of the wiring substrate by the solder. At a time of the reflow heating of the solder used to mount the semiconductor chip, in some cases, such a situation is caused that the solder used to fix the lead pins is fused and crawls up toward the top end side of the lead pins. Since a surface of the solder is oxidized, such a problem arises that, when the solder that crawls up toward the top end side of the lead pins constitutes the connecting portion, reliability of the electrical connection of the lead pins is lowered.

SUMMARY OF THE INVENTION

It is an object of the present invention to provide a semiconductor package equipped with lead pins, which can have a sufficient fitting strength and have high reliability of the electrical connection, and a method of manufacturing the same and a semiconductor device and a method of manufacturing the same.

The present invention is concerned with a semiconductor package, which includes a wiring substrate; a lead pin fixed to a connection pad on one surface side of the wiring substrate by solder; and a reinforcing resin layer formed on a surface of the wiring substrate on which the lead pin is provided, and having a projection-shaped resin portion which projects locally around the lead pin and covers a side surface of a base portion side of the lead pin.

In the present invention, the reinforcing resin layer is formed on the surface of the wiring substrate on the lead pin side, and the projection-shaped resin portion arranged to project locally around the base portion side of the lead pin is provided. In the preferred mode, the projection-shaped resin portion has a top surface extending from an outer peripheral portion of the lead pin to an outside, and a side surface constituting a non-identical surface to the top surface.

Accordingly, the lead pin is supported by the projection-shaped resin portion. Therefore, a fitting strength of the lead pin can be improved in contrast to the prior art.

In the semiconductor package of the present invention, the semiconductor device is constructed by mounting the semiconductor chip on the connection pad on the opposite side to the lead pin side by the solder.

When the lead-free solder is employed, in many cases the solder having a similar melting point is employed as the solder used to fix the lead pin and the solder used to mount the semiconductor chip. Therefore, when the solder used to mount the semiconductor chip on the semiconductor package is reflow-heated, the solder used to fix the lead pin is also reflowed simultaneously.

In the present invention, even in such a case, since the lead pin is supported by the projection-shaped resin portion, it can be prevented that the lead pin is inclined by the reflow of the solder. Also, even though the solder crawls up toward the top end side of the lead pin, the solder is covered with the projection-shaped resin portion. Therefore, there is no chance that the solder whose surface is oxidized is exposed on the surface of the lead pin, and reliability of the electrical connection of the lead pin can be enhanced.

Also, the present invention is concerned with a method of manufacturing a semiconductor package, which includes the steps of: fixing a lead pin onto a connection pad on one surface side of a wiring substrate by solder; and forming a reinforcing resin layer, which has a projection-shaped resin portion which projects locally around the lead pin and covers a side surface of a base portion side of the lead pin, by forming an uncured resin layer on a surface of the wiring substrate on which the lead pin is arranged, then arranging a pressing jig having an opening portion whose diameter is larger than a diameter of the lead pin on the resin layer in a state that the lead pin is inserted into the opening portion, and then curing the resin layer by an annealing while pressing the resin layer by means of the pressing jig.

By employing the manufacturing method of the present invention, the semiconductor package having the above structure can be manufactured easily. As the method of forming the uncured resin layer, a resin film in which the opening corresponding to the lead pin is provided may be pasted, or a liquid resin may be coated by the syringe or the dispenser.

As explained above, in the present invention, a sufficient fitting strength of the lead pins of the semiconductor package can be obtained, and reliability of the electrical connection of the lead pins can be enhanced.

DETAILED DESCRIPTION OF THE PREFERRED EMBODIMENTS

Embodiments of the present invention will be explained with reference to the accompanying drawings hereinafter.

Figure 1A:
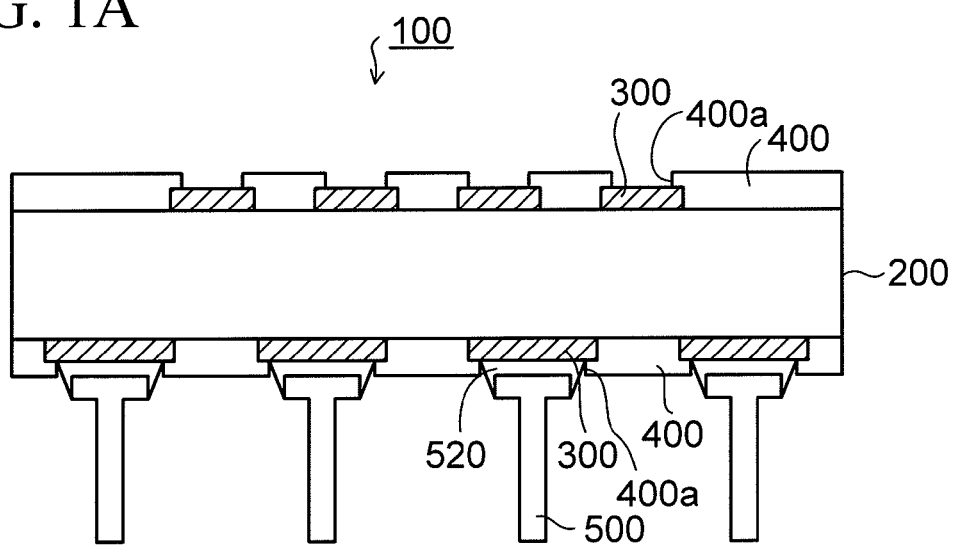
FIG. 1A is a sectional view showing a semiconductor package in the related art.

Prior to the explanation of embodiments of the present invention, the problem of the semiconductor package in the related art will be explained hereunder. As shown in FIG. 1A, in a wiring substrate 200 constituting a semiconductor package 100 in the related art, connection pads 300 and a solder resist 400 in which an opening portion 400a is provided on the connection pads 300 respectively are formed on both surface sides respectively. Then, a lead pin 500 is fixed to the connection pads 300 in a lower side of the wiring substrate 200 by a solder layer 520.

Figure 1B:
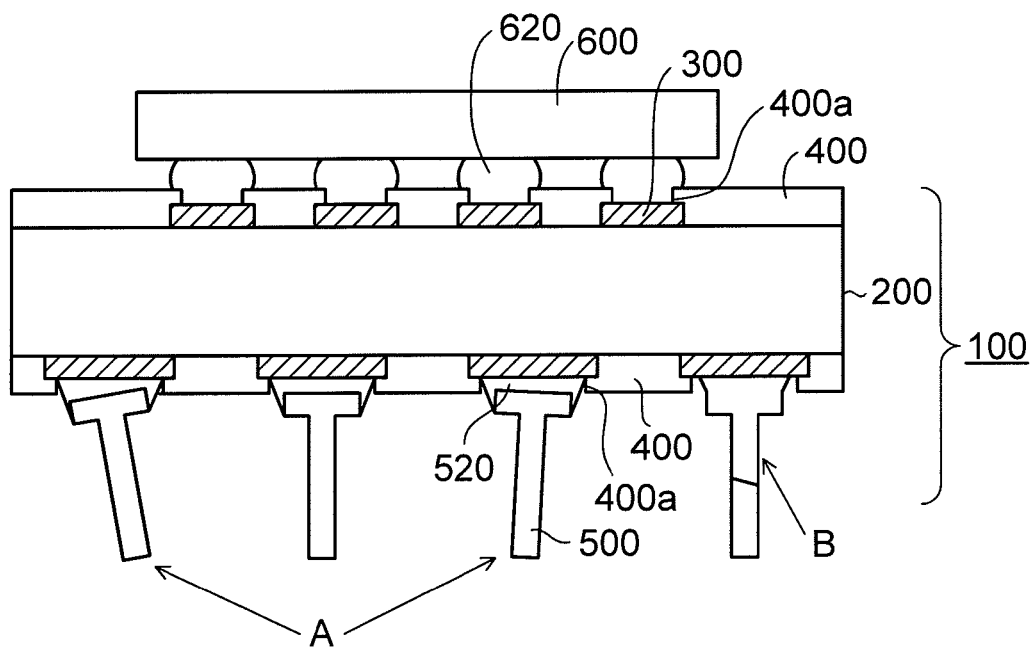
FIG. 1B is a sectional view showing the problem in mounting a semiconductor chip on the semiconductor package in FIG. 1A.

In FIG. 1B, the state in which a semiconductor chip 600 is be mounted on the semiconductor package 100 in FIG. 1A is shown. As shown in FIG. 1B, connection electrodes of the semiconductor chip 600 are flip-chip mounted on the connection pads 300 of the wiring substrate 200 by the solder, and the semiconductor chip 600 is connected electrically to the connection pads 300 via solder bumps 620.

At this time, in such a situation that both the solder layer 520 for fixing the lead pin 500 and the solder bump 620 for connecting the semiconductor chip 600 are made of solder materials having an approximate melting point respectively, when the solder used to mount the semiconductor chip 600 is heated by the reflow soldering, the solder layer 520 for fixing the lead pin 500 is also heated simultaneously by the reflow soldering.

For this reason, as shown in FIG. 1B, when the solder layer 520 for fixing the lead pin 500 is fused, the lead pin 500 is inclined (A portion) or the solder layer 520 crawls up toward the top end side of the lead pin 500 (B portion (in FIG. 1B, the solder flows out to the lower side)).

When the lead pin 500 is fixed in an inclined state, trouble arises upon inserting the lead pin 500 into the socket of the mounting substrate, and thus the yield in the time of mounting is lowered. Also, when the solder crawls up toward the top end side of the lead pin 500 and exposes there, such a problem may arise that, because a surface of the solder is oxidized, reliability of the electrical connection in inserting the lead pin 500 into the socket of the wiring substrate is lowered.

Here, when the tin(Sn)/lead(Pb)-based solder is employed, a melting point of the solder, which is used to fix the lead pin 500, can be set higher than a melting point of the solder, which is used to mount the semiconductor chip 600, by adjusting material composition, etc. of the solder. In this case, even when the reflow-heating is applied in mounting the semiconductor chip 600, because the solder layer 520 used to fix the lead pin 500 is not reflowed, occurrence of the above failure can be avoided.

In recent years, the use of the lead-free solder that does not contain lead has been begun with consideration for the environment protection. Since the lead-free solder has a melting point higher than the tin/lead-based solder (e.g., about 20° C.) and has poor wettability, etc., there is such a tendency that its process margin is narrow.

Therefore, when reliability of the fitting of the lead pins 500 and the connection of the semiconductor chip 600 is taken into consideration, the types of the usable solder are small. Thus, out of them, it is difficult to use the solders whose melting points are largely different mutually. As a consequence, when the lead-free solder is used, in many cases the solders having an equivalent melting point respectively are used as the solder used to fix the lead pin 500 and the solder used to mount the semiconductor chip 600.

In this manner, the above failure in fitting the lead pin 500 is ready to occur particularly when the lead-free solder is used. Here, even though the tin/lead-based solder is used, it is needless to say that, when the solder having the equivalent melting point is used on the lead pin 500 side and the semiconductor chip 600 side, the similar problem arises.

In embodiments of the present invention illustrated hereinafter, the foregoing failure can be solved.

First Embodiment

FIG. 2 to FIG. 6 are sectional views showing a method of manufacturing a semiconductor package according to a first embodiment of the present invention.

Figure 2A:
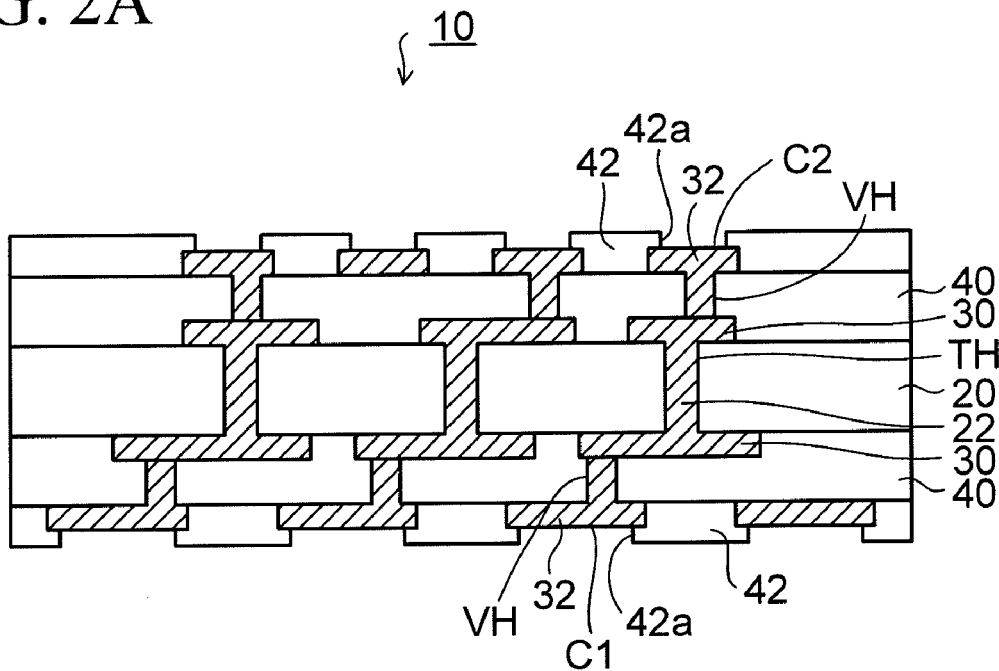
FIGS. 2A and 2B are sectional views (#1) showing a method of manufacturing a semiconductor package according to a first embodiment of the present invention.

In the method of manufacturing the semiconductor package of the first embodiment, first, a wiring substrate 10 shown in FIG. 2A is prepared. In the wiring substrate 10, an insulating core substrate 20 made of a glass epoxy resin, or the like is arranged in a center portion in the thickness direction, and through holes TH are provided in the core substrate 20. First wiring layers 30 connected mutually via through electrodes 22 filled in the through holes TH are formed on both surface sides of the core substrate 20 respectively. Otherwise, the first wiring layers 30 on both surface sides may be connected mutually via through hole plating layers (through electrodes) provided on inner walls of the through holes TH in the core substrate 20, and then the remained holes of the through holes TH may be filled with a resin.

An interlayer insulating layer 40 for covering the first wiring layers 30 is formed on both surface sides of the core substrate 20 respectively. The interlayer insulating layer 40 is formed of an insulating resin such as an epoxy resin, a polyimide resin, or the like, and is formed by pasting a resin film, or the like. Also, via holes VH each reaching the first wiring layer 30 are provided in the interlayer insulating layer 40 on both surface sides of the core substrate 20 respectively. Second wiring layers 32 connected to the first wiring layer 30 via the via hole VH (via conductor) are formed on the interlayer insulating layer 40 on both surface sides of the core substrate 20 respectively.

Also, a solder resist 42 in which opening portions 42a are formed on connection pads C1, C2 of the second wiring layers 32 is formed on both surface sides of the core substrate 20 respectively. A contact portion (not shown) in which nickel layer/gold plating layer are formed in order from the bottom is provided on surfaces of the connection pads C1, C2 of the second wiring layers 32 on both surface sides of the core substrate 20 respectively.

The connection pad C1 of the second wiring layer 32 on the lower surface side of the wiring substrate 10 is a lead pad which is used to fit the lead pin. The connection pad C2 of the second wiring layer 32 on the upper surface side is a chip pad which is used to connect a semiconductor chip.

Here, the number of stacked wiring layers formed on both surface sides of the core substrate 20 can be set arbitrarily. Also, a coreless wiring substrate without the core substrate 20 may be employed.

Figure 2B:
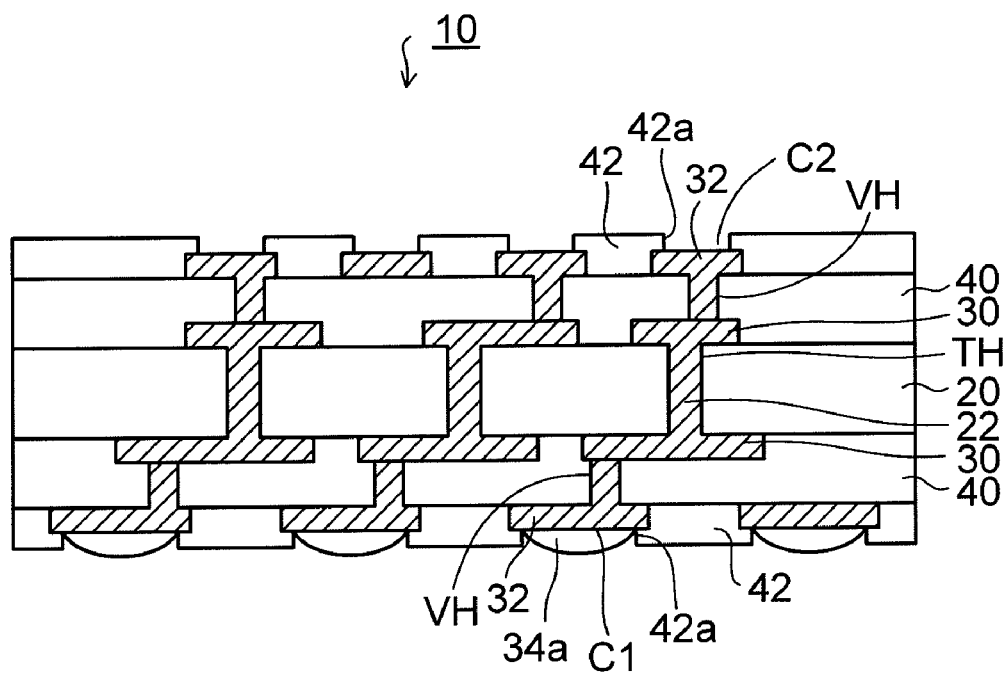

Then, as shown in FIG. 2B, a solder material 34a is formed on (in FIG. 2B, under) the connection pads C1 of the second wiring layers 32 on the lower surface side of the wiring substrate 10 by the printing, or the like. As the solder material 34a, the lead-free solder is used, e.g., tin(Sn)/antimony(Sb)-based solder is used. A melting point of the tin/antimony-based solder is about 230° C.

Figure 3A:
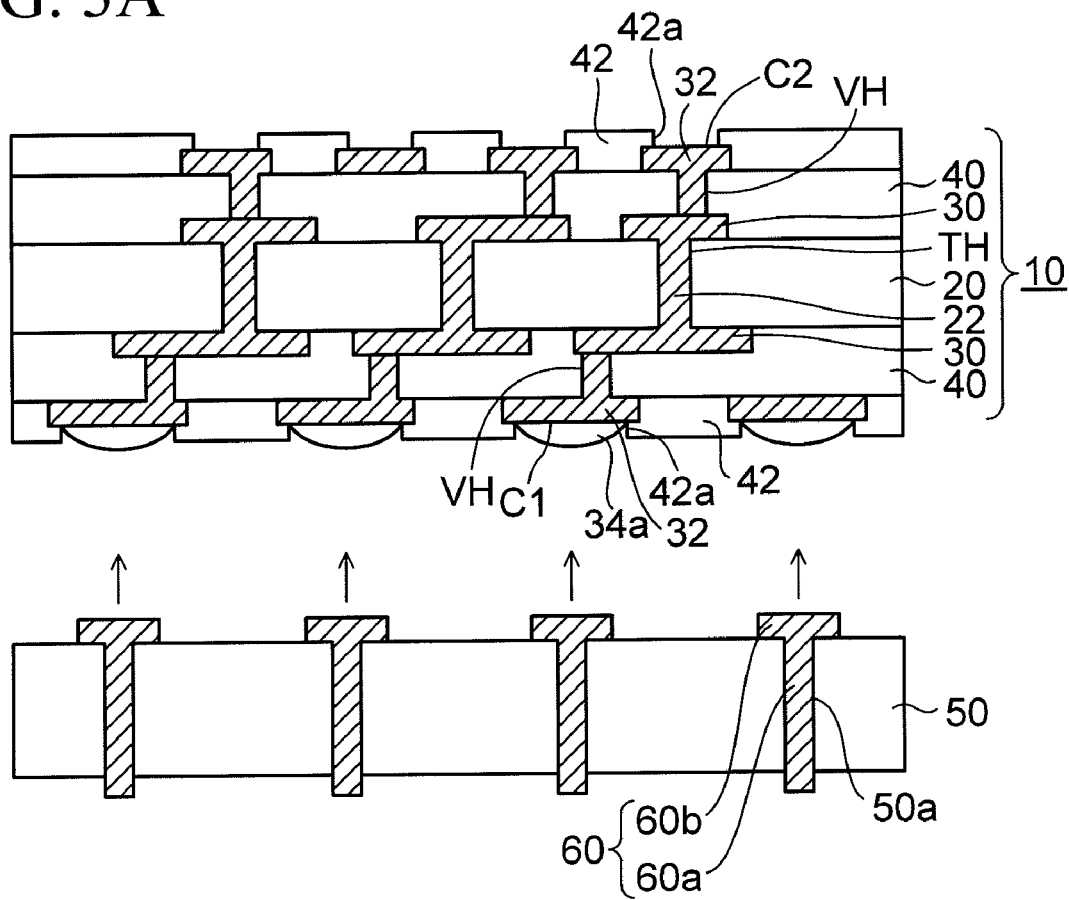
FIGS. 3A and 3B are sectional views (#2) showing the method of manufacturing the semiconductor package according to the first embodiment of the present invention.

As shown in FIG. 3A, a pin mounting jig 50 used to fit the lead pin is prepared. A plurality of insertion holes 50a are provided in the pin mounting jig 50. A plurality of insertion holes 50a correspond to the connection pads C1 on the lower surface side of the wiring substrate 10.

Then a lead pin 60 is inserted into the insertion holes 50a of the pin mounting jig 50 respectively. The lead pin 60 is constructed by a pin portion 60a and a head portion 60b that is provided to one end side to have a large diameter. Also, the lead pin 60 is constructed by coating nickel layer/gold layer in order from the bottom on a surface of a pin main body, which is formed of copper or copper alloy, for example. The pin portion 60a of the lead pin 60 is inserted into the insertion holes 50a of the pin mounting jig 50 respectively, and respective head portions 60b are held on an upper surface of the pin mounting jig 50.

Figure 3B:
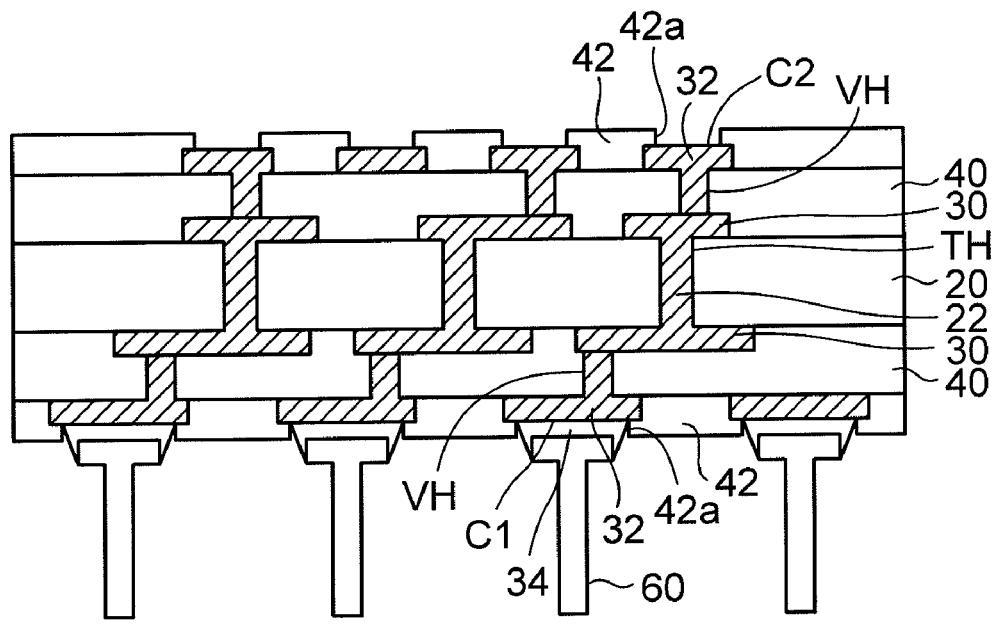

Then, as shown in FIGS. 3A and 3B, the pin mounting jig 50 in which a plurality of lead pins 60 are aligned is faced to the lower surface side of the wiring substrate 10, and then the head portions 60b of the lead pins 60 are pushed onto the solder materials 34a provided on the connection pads C1. Then, the solder materials 34a are reflow-heated in a temperature atmosphere at about 270° C. Thus, the lead pins 60 are fixed to the connection pads C1 of the wiring substrate 10 by the solder layer 34 individually.

Figure 4A:
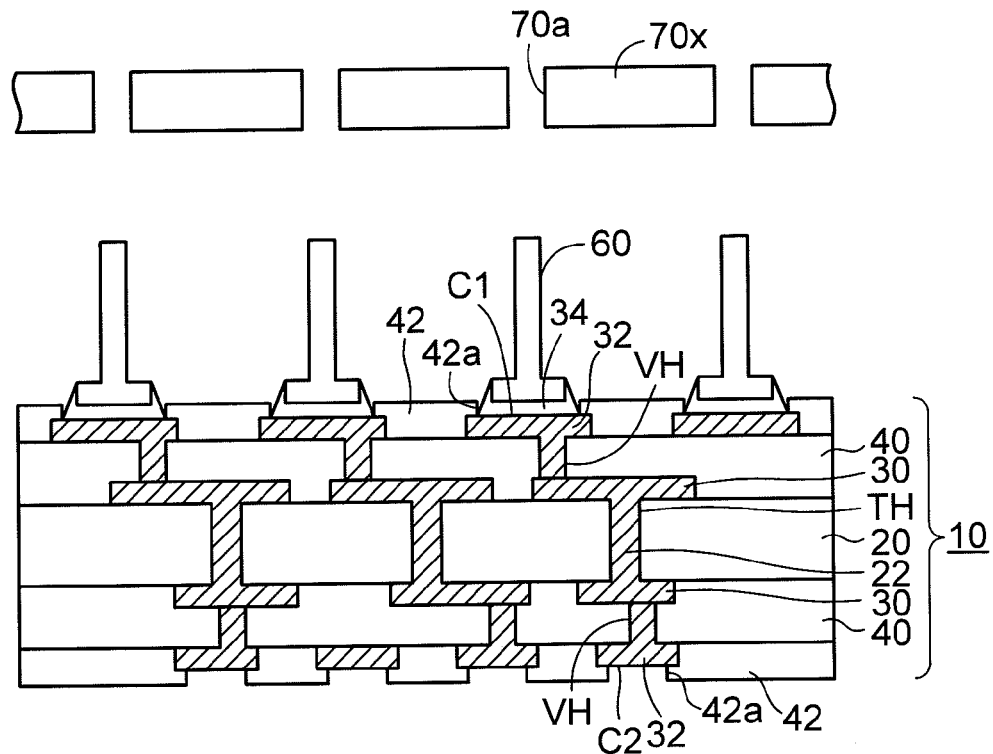
FIGS. 4A and 4B are sectional views (#3) showing the method of manufacturing the semiconductor package according to the first embodiment of the present invention.

Then, as shown in FIG. 4A, a structure in FIG. 3B is reversed up and down to direct the lead pins 60 upward. Then, a resin film 70x in which a plurality of opening portions 70a are provided is prepared. The resin film 70x is formed of an uncured resin (B-stage), and its thickness is set to 100 μm to 200 μm, for example. As the resin film 70x, epoxy resin, polyimide resin, acrylic resin, mixed resin of epoxy resin and acrylic resin, two-layered structure of epoxy resin/polyimide resin stacked in order from the bottom, or the like is used.

As the concrete material of the resin film 70x, an epoxy resin, in which calcium carbonate is contained by about 20% as a filler and whose Tg (glass transition temperature) is about 26° C., or a mixed resin of an epoxy resin and silicone, in which silica is contained by about 70% as a filler and whose Tg (glass transition temperature) is about 139° C., is used. Also, when a liquid resin is used as described later, a viscosity of the above epoxy resin is set to 4.5 Pa·s, and a viscosity of the mixed resin of an epoxy resin and silicon is set to 60 Pa·s.

The opening portions 70a of the resin film 70x are provided in positions which correspond to the lead pins 60 fitted to the wiring substrate 10.

Figure 4B:
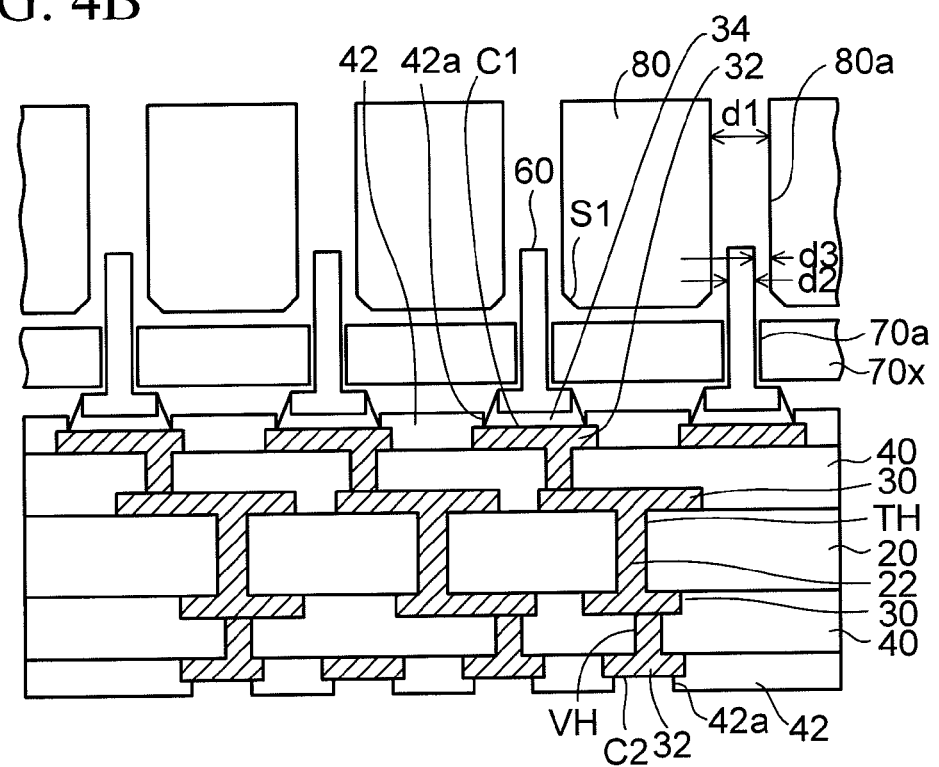

Then, as shown in FIG. 4B, the lead pins 60 of the wiring substrate 10 are inserted into the opening portions 70a of the resin film 70x, and the resin film 70x is arranged on the wiring substrate 10. A pressing jig 80 for pressing the resin film 70x is prepared. In the pressing jig 80, opening portions 80a are provided in portions which correspond to the lead pins 60 fitted to the wiring substrate 10. An inclined surface S1 that is cut in such that a diameter is increased as the position becomes the lower side is provided on bottom inner surfaces of the opening portions 80a respectively.

A diameter d1 of the opening portion 80a in the pressing jig 80 is set larger than a diameter d2 of the lead pin 60. For example, when a diameter d2 of the lead pin 60 is 300 μm, a diameter d1 of the opening portion 80a in the pressing jig 80 is set to 900 μm. In this case, a clearance d3 between the lead pin 60 and a side surface of the opening portion 80a in the pressing jig 80 is 300 μm.

Figure 5:
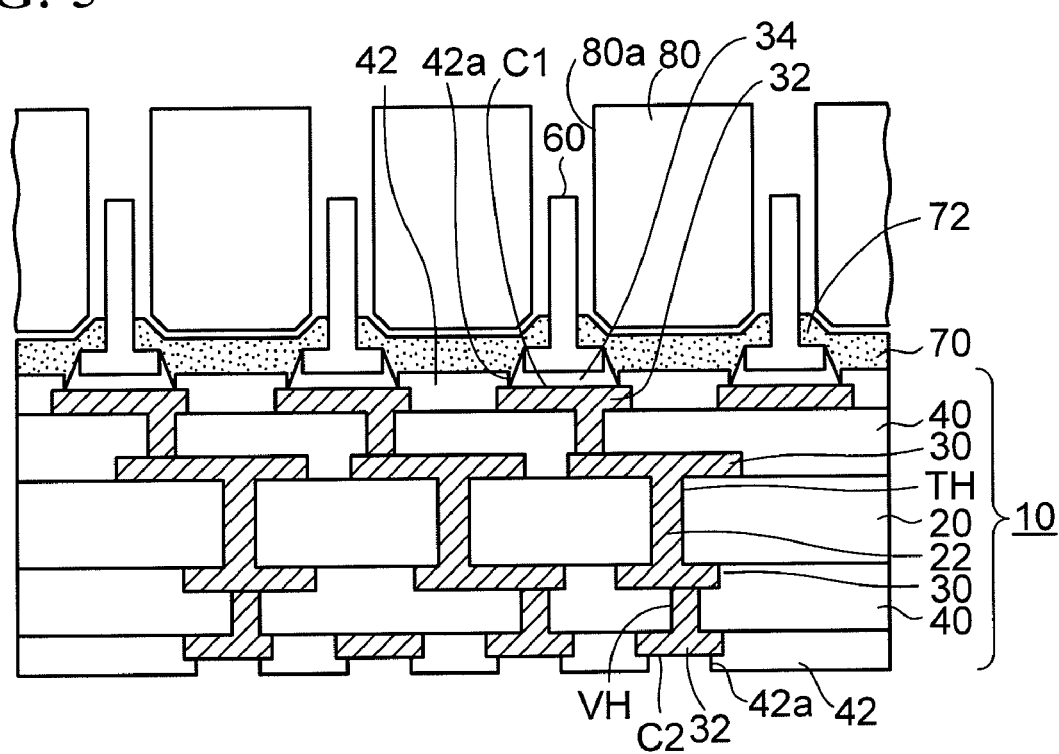
FIG. 5 is a sectional view (#4) showing the method of manufacturing the semiconductor package according to the first embodiment of the present invention.

Then, as shown in FIG. 4B and FIG. 5, the lead pins 60 of the wiring substrate 10 are inserted into the opening portion 80a in the pressing jig 80, and thus the resin film 70x is pressed to the wiring substrate 10 side by the pressing jig 80. At this time, simultaneously the resin film 70x is heat-treated in a temperature atmosphere of 150° C. to 220° C.

Accordingly, as shown in FIG. 5, the uncured resin film 70x is cured while flowing, and thus a reinforcing resin layer 70 is formed on the upper surface side of the wiring substrate 10 such that the base portion side of the lead pins 60 is wrapped around. At this time, the resin film 70x is cured while flowing to the upper side from the clearance d3 (FIG. 4B) between the lead pin 60 and the side surface of the opening portion 80a in the pressing jig 80 by a pressing force applied from the pressing jig 80. Thus, projection-shaped resin portions 72 which project locally around the base portion side of the lead pin 60 are formed.

As explained in detail later, the projection-shaped resin portion 72 has a top surface that extends outward from the outer peripheral portion of the lead pin 60 by a predetermined dimension, and its side surface constitutes an inclined surface formed along the inclined surface S1 of the opening portion 80a in the pressing jig 80.

Figure 6:
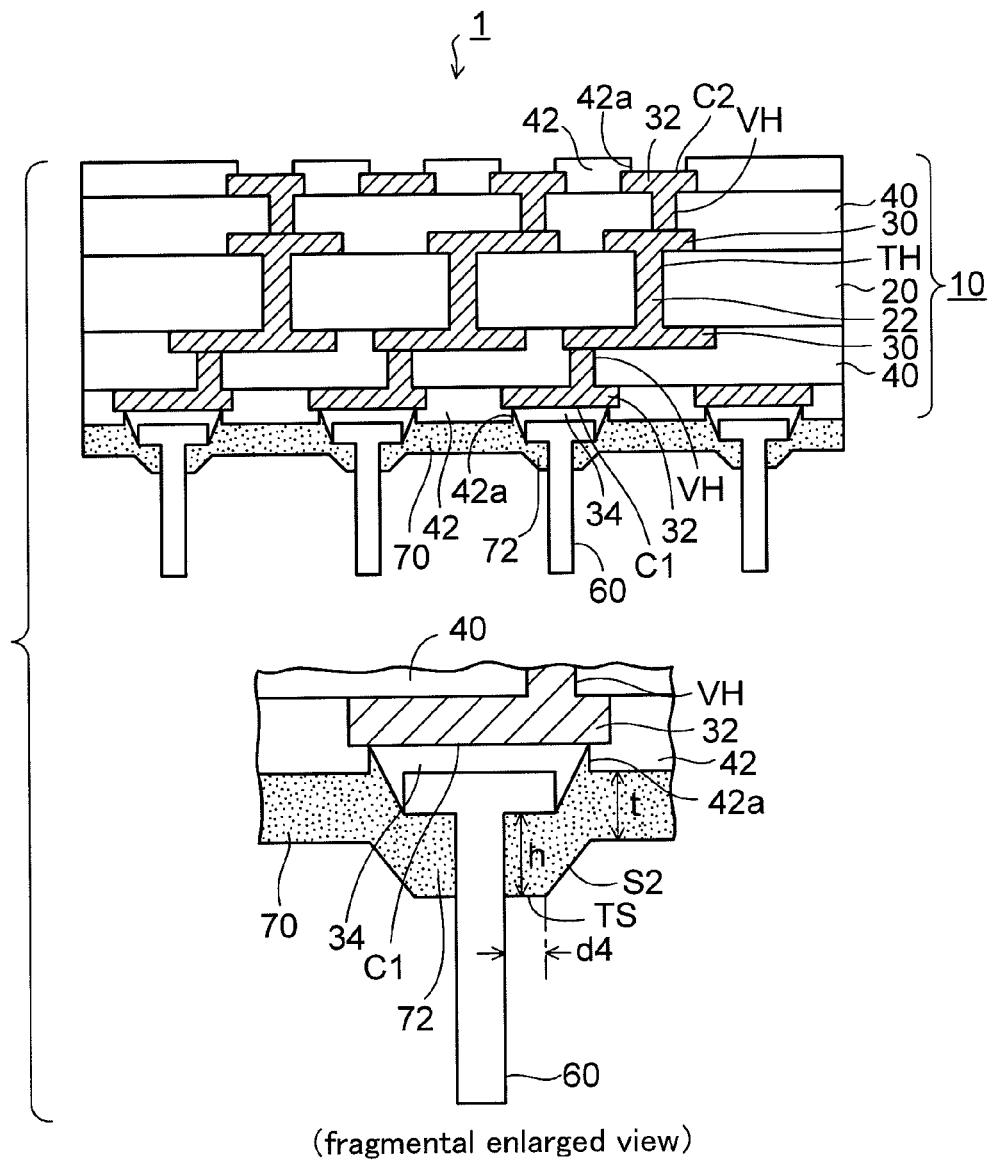
FIG. 6 is a sectional view showing the semiconductor package according to the first embodiment of the present invention.

Then, as shown in FIG. 6, the pressing jig 80 is separated from the wiring substrate 10. Accordingly, a semiconductor package 1 in the first embodiment is obtained. In FIG. 6, a state where the wiring substrate 10 in FIG. 5 is reversed up and down is illustrated.

Figure 7:
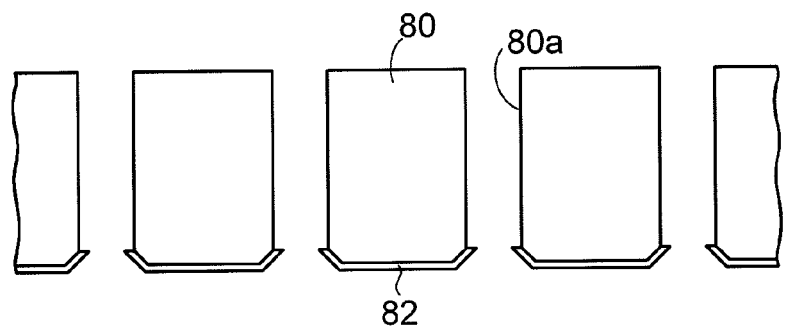
FIG. 7 is a sectional view showing a pressing jig having a release material used in the method of manufacturing the semiconductor package according to the first embodiment of the present invention.

In this case, as shown in FIG. 7, a releasing material 82 may be provided on the portion in the lower surface side of the pressing jig 80, where contacts the reinforcing resin layer 70. As a result, even when the pressing jig 80 is formed of the material which sticks readily to the reinforcing resin layer 70, the pressing jig 80 can be separated easily from the reinforcing resin layer 70 by a function of the release material.

Figure 8A:
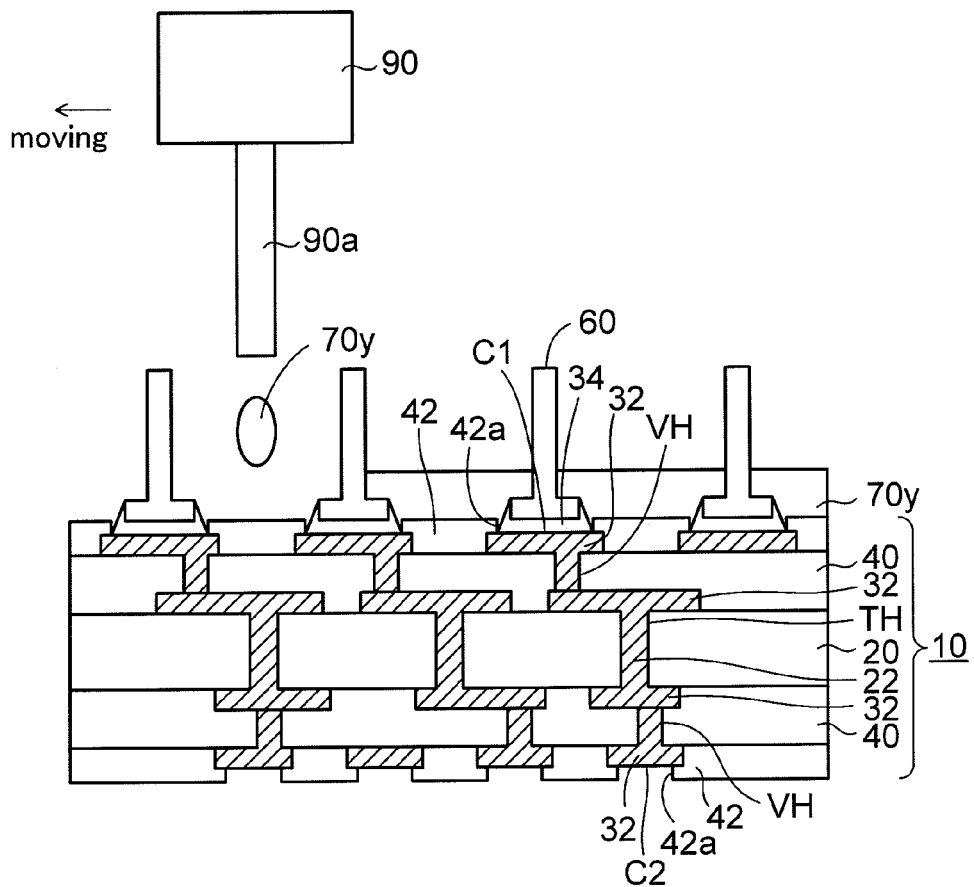
FIGS. 8A and 8B are sectional views showing another method of forming a reinforcing resin layer in the method of manufacturing the semiconductor package according to the first embodiment of the present invention.
Figure 8B:
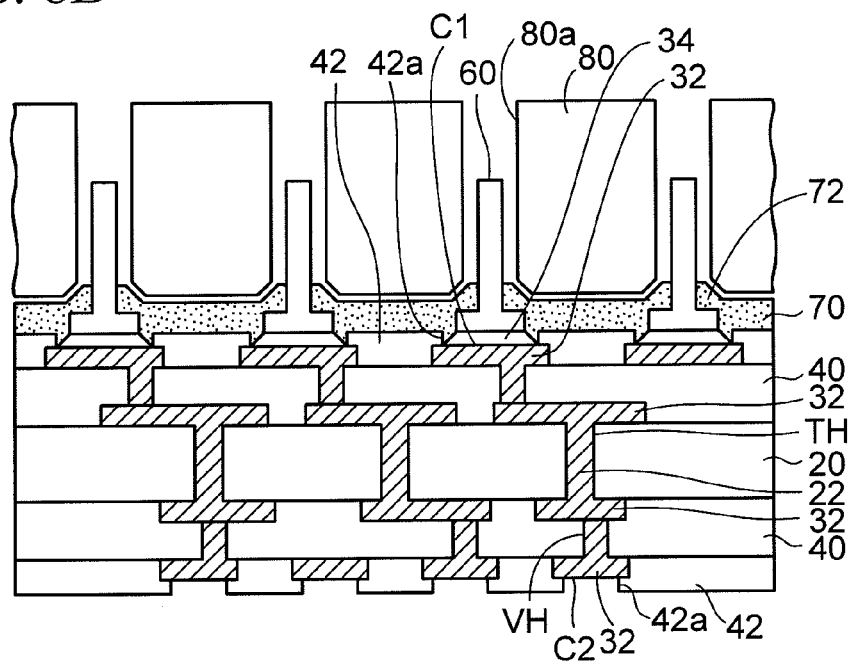

In FIGS. 8A and 8B, another method of forming the reinforcing resin layer 70 is shown. As shown in FIG. 8A, instead of the use of the resin film 70x in which the opening portions 70a are provided, a liquid resin 70y may be coated by a syringe 90 (dispenser). The syringe 90 has a nozzle 90a for injecting the liquid resin 70y, and the liquid resin 70y is coated from the nozzle 90a. The liquid resin 70y (uncured resin layer) is formed on the whole surface of the wiring substrate 10 by moving the syringe 90 in the horizontal direction (X-Y direction).

Then, similarly to above FIG. 5, as shown in FIG. 8B, the lead pins 60 of the wiring substrate 10 are inserted into the opening portions 80a of the pressing jig 80, and the liquid resin 70y is cured by the annealing in a state that the liquid resin 70y is pressed by the pressing jig 80. Accordingly, similarly to above FIG. 5, the reinforcing resin layer 70 for supporting and reinforcing the lead pins 60 is formed on the upper surface side of the wiring substrate 10, and the projection-shaped resin portion 72 is provided around the lead pins 60. Then, similarly the pressing jig 80 is separated from the wiring substrate 10. Thus, a semiconductor package similar to FIG. 6 (the semiconductor package 1) can be obtained.

As shown in FIG. 6, in the semiconductor package 1 of the first embodiment, the lead pins 60 are provided to the connection pads C1 of the second wiring layers 32 in the lower side of the wiring substrate 10 which has the structure explained above in FIG. 2A, by the solder layer 34 to stand upright thereon. The reinforcing resin layer 70 is formed on the lower surface side of the wiring substrate 10 such that the base portion side of the lead pins 60 is wrapped around.

By reference to a fragmental enlarged view in FIG. 6, the reinforcing resin layer 70 is projected locally around the lead pins 60 toward the top end side, and the projection-shaped resin portion 72 for covering the side surfaces of the base portions of the lead pins 60 is provided around the lead pins 60. The projection-shaped resin portion 72 has a top surface TS (in FIG. 6, a bottom surface) that extends outward from the outer peripheral portion of the lead pin 60 by a predetermined dimension d4, and a side surface S2 that constitutes a non-identical surface to the top surface TS. The side surface S2 is shaped into an inclined surface in which an outer diameter of the projection-shaped resin portion 72 is increased as the position becomes the base portion side of the lead pin 60.

In an example in FIG. 6, the top surface TS of the projection-shaped resin portion 72 constitutes a flat surface that is parallel with the substrate surface of the wiring substrate 10 (the core substrate 20), but the top surface TS may be formed as a non-parallel surface and a non-flat surface to the wiring substrate 10. Also, in the example in FIG. 6, the side surface S2 of the projection-shaped resin portion 72 constitutes the inclined surface. In this case, the side surface S2 of the projection-shaped resin portion 72 can be formed as a perpendicular surface by adjusting an inclined angle of the inclined surface S1 in the bottom portion of the opening portion 80a in the pressing jig 80 mentioned above.

As shown in the foregoing example (FIG. 4B), when the diameter d2 of the pin portion 60a of the lead pin 60 is 300 μm and the diameter d1 of the opening portion 80a of the pressing jig 80 is 900 μm, the dimension d4 of the top surface TS of the projection-shaped resin portion 72 becomes 300 μm. Also, in the case of above example, a thickness t of the reinforcing resin layer 70 formed between the lead pins 60 is 100 μm to 200 μm, and a height h of the projection-shaped resin portion 72 is 50 μm to 400 μm.

Figure 9A:
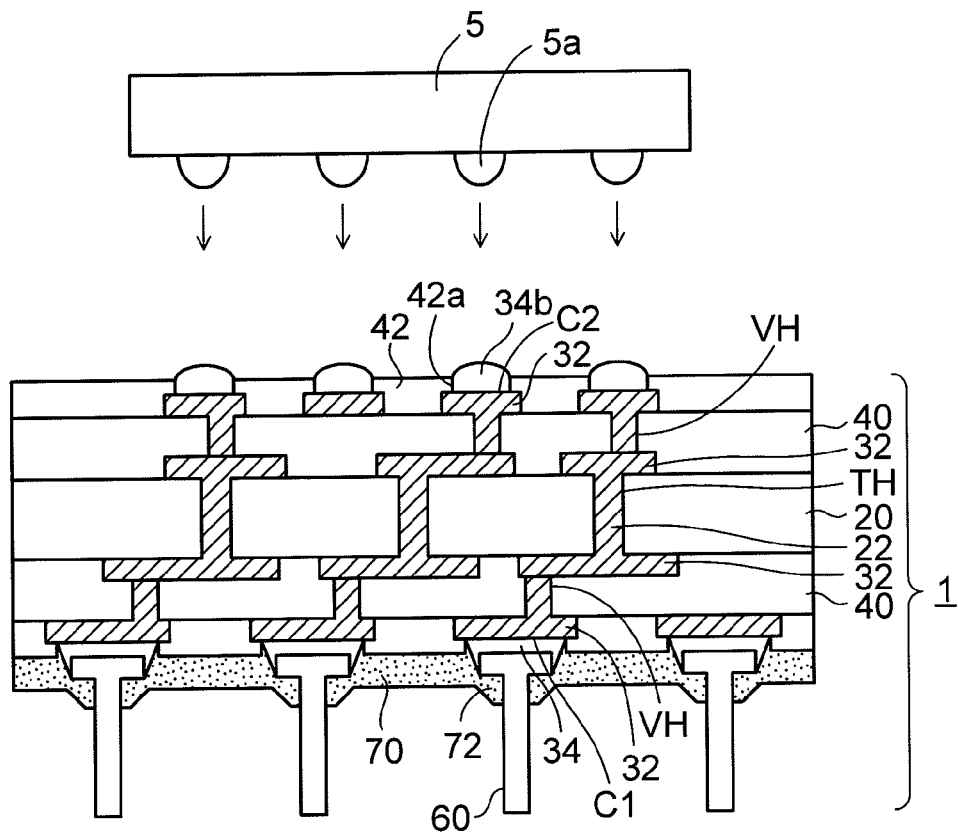
FIGS. 9A and 9B are sectional views showing a method of manufacturing a semiconductor device according to the first embodiment of the present invention.

Next, a method of mounting the semiconductor chip on the semiconductor package 1 of the first embodiment will be explained hereunder. As shown in FIG. 9A, first, a solder material 34b used to mount the semiconductor chip on the connection pads C2 of the second wiring layers 32 on the upper surface side in the semiconductor package 1 in FIG. 6 is formed by the printing, or the like. As the solder material 34b, the lead-free solder is used and, for example, tin (Sn)/silver (Ag)/copper (Cu)-based solder is used.

A melting point of the tin/silver/copper-based solder is 217 to 220° C., and is close to a melting point (230° C.) of the solder material 34a (tin/antimony-based solder) used to fix the lead pin 60. Then, a semiconductor chip 5 (LSI chip) having connection electrodes 5a (solder electrodes, or the like) is prepared.

Figure 9B:
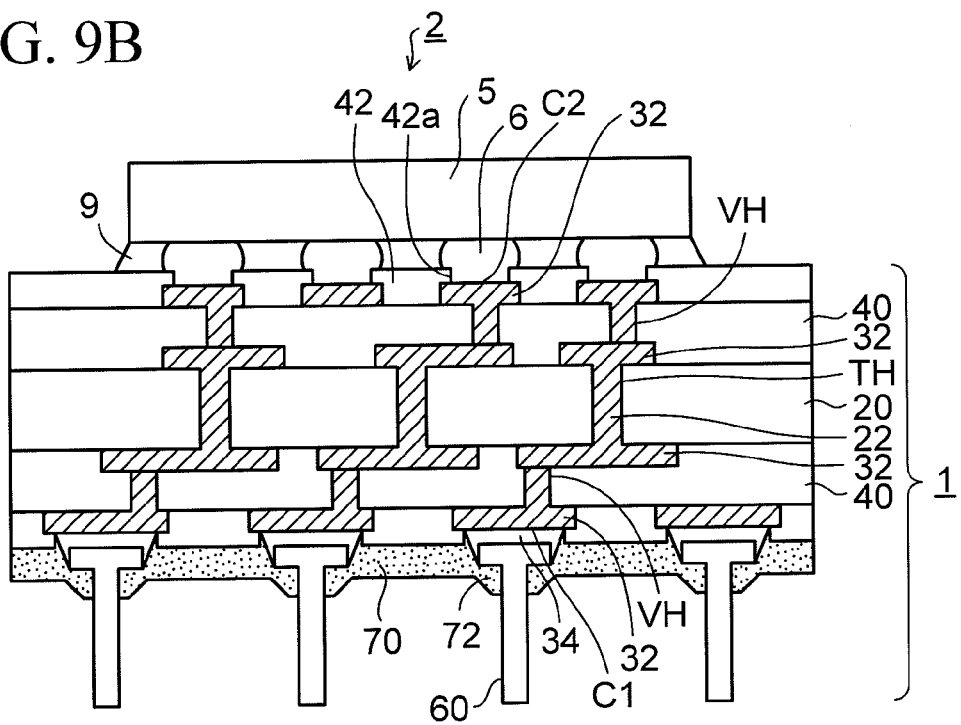

Then, as shown in FIG. 9B, the connection electrode 5a of the semiconductor chip 5 is arranged on the solder materials 34b of the connection pads C2 of the semiconductor package 1, and then the solder materials 34b are reflow-heated in a temperature atmosphere at 230° C. As a result, the semiconductor chip 5 is flip-chip connected to the connection pads C2 of the wiring substrate 10 by solder bumps 6.

Then, an underfill resin 9 is filled into the lower side of the semiconductor chip 5. In this manner, the semiconductor chip 5 is flip-chip connected to the connection pads C2 on the opposite side to the lead pins 60 of the semiconductor package 1, and thus a semiconductor device 2 of the first embodiment is obtained.

At this time, a melting point (230° C.) of the solder material 34 (tin/antimony-based solder) used to fix the lead pin 60 is equal to a temperature (230° C.) at which the solder material 34b (tin/silver/copper-based solder) used to mount the semiconductor chip 5 is reflow-heated. Therefore, upon mounting the semiconductor chip 5, a solder layer 34 used to fix the lead pin 60 is also reflowed at the same time.

In the first embodiment, the surrounding portion of the base portion side in the lead pin 60 is covered with the projection-shaped resin portion 72 coupled to the reinforcing resin layer 70. Therefore, a mechanical strength (bending strength) of the lead pin in the lateral direction can be improved rather than the case where the base portion of the lead pin 60 is covered with the thin resin layer. As a result, there is no fear that the lead pin 60 is inclined even when the solder layer 34 used to fix the lead pin 60 is reflowed.

Also, as explained above in the column of the related art, when the solder layer 34 for fixing the lead pin 60 is fused in flip-chip connecting the semiconductor chip 5, the solder crawls up toward the top end side of the lead pin 60.

Figure 10:
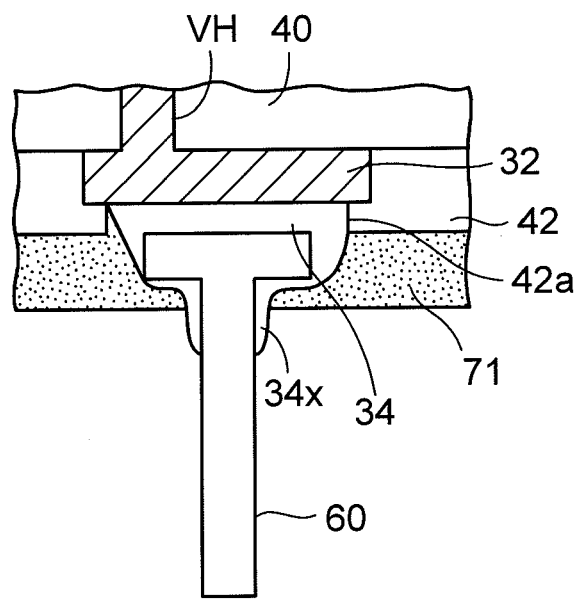
FIG. 10 is a fragmental sectional view showing a state in the crawling-up of the solder when a reinforcing resin layer without a projection-shaped resin portion is employed.

As shown in FIG. 10, when the base portion of the lead pin 60 is covered with the thin resin layer 71 which has no projection-shaped resin portion, the solder layer 34 is fused and crawls up toward the top end side of the lead pin 60 (in FIG. 10, flows out to the lower side), and consequently solder 34x often is formed to protrude from the surface of the lead pin 60 exposed from a resin layer 71. The surface of the solder 34x which flows out to the top end side of the lead pin 60 is oxidized, so that the connection failure may be caused in inserting the lead pin 60 into the socket of the mounting substrate.

Figure 11:
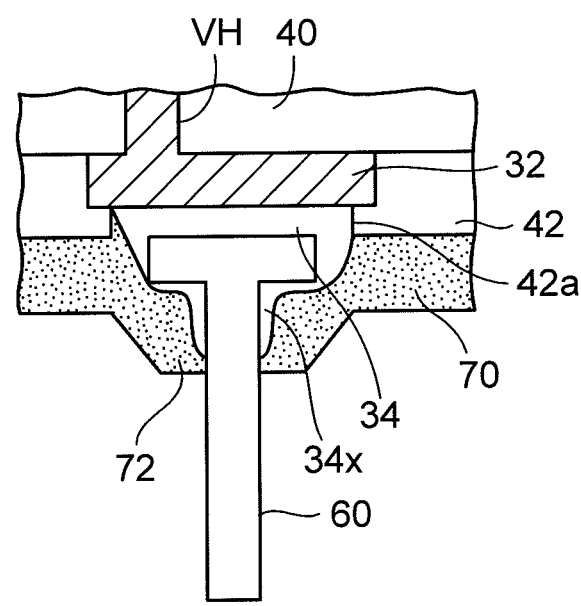
FIG. 11 is a fragmental sectional view showing a state in the crawling-up of the solder in the semiconductor device according to the first embodiment of the present invention.

However, in the semiconductor device 2 of the first embodiment, as shown in FIG. 11, the base portion side of the lead pin 60 can be covered with the projection-shaped resin portion 72 whose thickness is longer than a flow-out distance of the solder. Therefore, even when the solder 34x which flows out from the solder layer 34 crawls up toward the top end side of the lead pin 60, the flow-out of the solder 34x is suppressed within the projection-shaped resin portion 72. As a result, such a fear is eliminated that the climbed solder 34x is exposed, and reliability of the electrical connection can be enhanced.

In this way, in the method of manufacturing the semiconductor device of the first embodiment, even when a melting point of the solder layer 34 used to fix the lead pin 60 is equal to or lower than a temperature at which the solder material 34b used to mount the semiconductor chip 5 is reflow-heated, it can be prevented that the lead pin 60 is inclined, and also high reliability of the electrical connection of the lead pin 60 can be obtained.

In the first embodiment, the mode in which the lead-free solder is used as both the solder material 34a on the lead pin 60 side and the solder material 34b on the semiconductor chip 5 side is explained as the mode in which the particularly conspicuous effect can be achieved. But various solder material (tin/lead-based solder, tin/lead/antimony-based solder, and the like) having various melting points may be used.

In the semiconductor package 1 of the first embodiment, the base portion side of the lead pin 60 is supported by the projection-shaped resin portion 72. Therefore, irrespective of whether or not the solder layer 34 on the lead pin 60 side is fused in mounting the semiconductor chip 5, a fitting strength of the lead pin 60 can be improved rather than the prior art before or after the semiconductor chip 5 is mounted.

Here, the method of increasing a thickness of the reinforcing resin layer over the whole of wiring substrate not to expose the solder which crawls up may be considered. In this event, when the thick resin layer is formed on the whole surface of the wiring substrate, a warp of the wiring substrate 10 is caused readily and also a deterioration of the reliability is brought about easily. For this reason, it is important that the resin layer whose thickness is set to a required minimum level not to cause a warp should be formed on the area except the projection-shaped resin portion 72 being formed around the leas pins 60.

Second Embodiment

FIG. 12 to FIG. 15 are sectional views showing a method of manufacturing a semiconductor package according to a second embodiment of the present invention. In the foregoing first embodiment, the reinforcing resin layer 70 is formed of the resin film 70x of a single layer such as an epoxy resin, or the like. Sometimes there is a case that flame retardancy is provided to the surface of the semiconductor package on the lead pin side, but it is difficult to obtain the flame retardancy by the single epoxy resin.

Also, a rigidity of resin film 70x of the single layer is low. Therefore, such a situation is supposed that its handling during the manufacturing step is not stable and thus the handling becomes difficult. Also, the projection-shaped resin portion 72 is formed by fluidizing resin film 70x of the single layer. Therefore, there is a possibility that a clearance is produced between the lead pin 60 and the projection-shaped resin portion 72, and it is feared that the crawling-up of the solder cannot be prevented perfectly.

In the second embodiment, such failure can be solved.

In the second embodiment, explanation will be made hereunder by enumerating the coreless wiring substrate as an example of the wiring substrate.

Figure 12A:
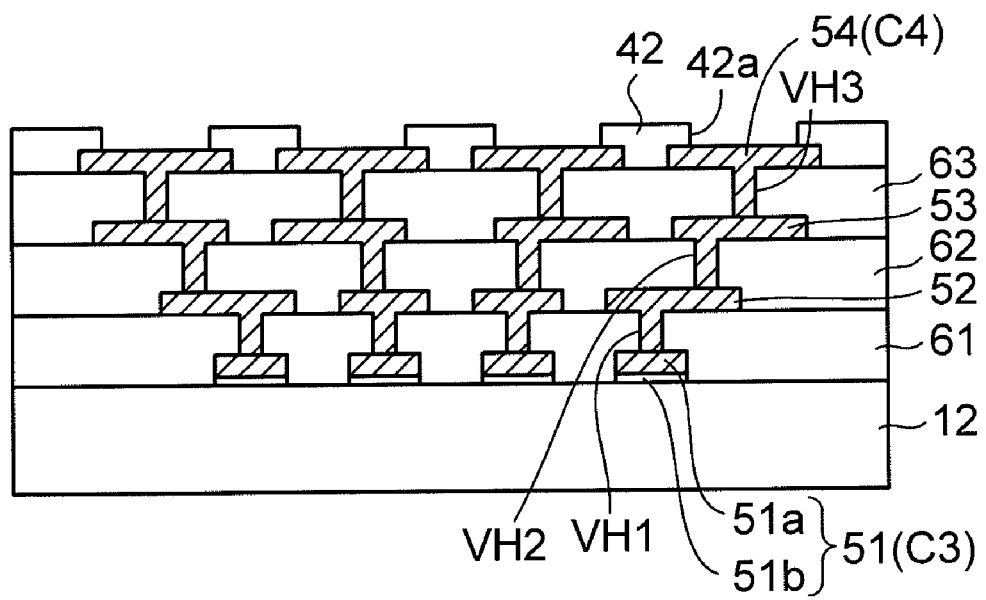
FIGS. 12A and 12B are sectional views (#1) showing a method of manufacturing a semiconductor package according to a second embodiment of the present invention.

First, steps required until a sectional structure shown in FIG. 12A is obtained will be explained hereunder. As shown in FIG. 12A, first wiring layers 51 are formed on a supporting plate 12. In FIG. 12A, connection pads C3 of the first wiring layers 51 are shown. The first wiring layer 51 (connection pad C3) is constructed by stacking a contact layer 51b made of gold layer/nickel layer, or the like and a wiring portion 51a formed thereon in order from the bottom.

Then, a first interlayer insulating layer 61 for covering the first wiring layers 51 is formed, and then first via holes VH1 reaching the first wiring layer 51 are formed in the first interlayer insulating layer 61. Then, second wiring layers 52 each connected to the first wiring layer 51 via the first via hole VH1 (via conductor) are formed on the first interlayer insulating layer 61.

Then, similarly, a second interlayer insulating layer 62 for covering the second wiring layers 52 is formed, and then second via holes VH2 reaching the second wiring layer 52 are formed in the second interlayer insulating layer 62. Then, third wiring layers 53 each connected to the second wiring layer 52 via the second via hole VH2 (via conductor) are formed on the second interlayer insulating layer 62.

Then, similarly, a third interlayer insulating layer 63 for covering the third wiring layers 53 is formed, and then third via holes VH3 reaching the third wiring layer 53 are formed in the third interlayer insulating layer 63. Then, fourth wiring layers 54 each connected to the third wiring layer 53 via the third via hole VH3 (via conductor) are formed on the third interlayer insulating layer 63. Then, the solder resist 42 in which the opening portions 42a are provided on connection pads C4 of the fourth wiring layers 54 is formed.

With the above, a four-layered build-up wiring layer is formed on the supporting plate 12. The number of stacked layers can be set arbitrarily.

Figure 12B:
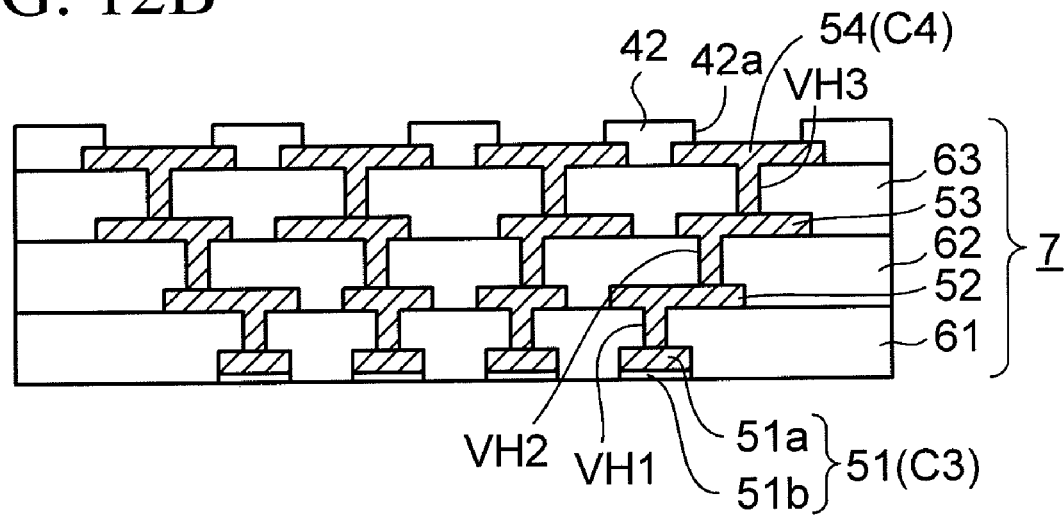

Then, as shown in FIG. 12B, the supporting plate 12 is removed from the build-up wiring layer. Accordingly, the coreless wiring substrate 7 constructed by the four-layered build-up wiring layer is obtained. The connection pads C3 of the first wiring layers 51 of the coreless wiring substrate 7 act as the chip pads to which the semiconductor chip is connected, and the connection pads C4 of the fourth wiring layers 54 act as the lead pads to which the lead pins are fitted.

Preferably a thickness of the coreless wiring substrate 7 should be set to 200 μm to 600 μm, and furthermore it is possible to make it the thinner type.

Figure 13A:
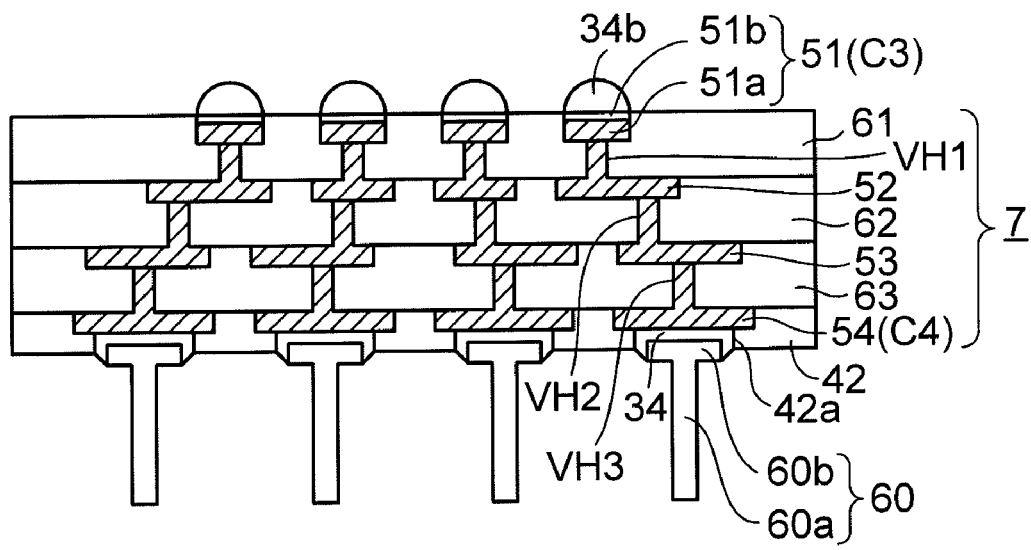
FIGS. 13A and 13B are sectional views (#2) showing the method of manufacturing the semiconductor package according to the second embodiment of the present invention.

Then, as shown in FIG. 13A, the coreless wiring substrate 7 in FIG. 12B is reversed up and down, and the solder material 34b is formed on the connection pads C3 (the first wiring layers 51). Then, according to the method similar to the first embodiment, the head portion 60b of the lead pin 60 is fixed to the connection pads C4 (the fourth wiring layers 54) by the solder layer 34.

Figure 13B:
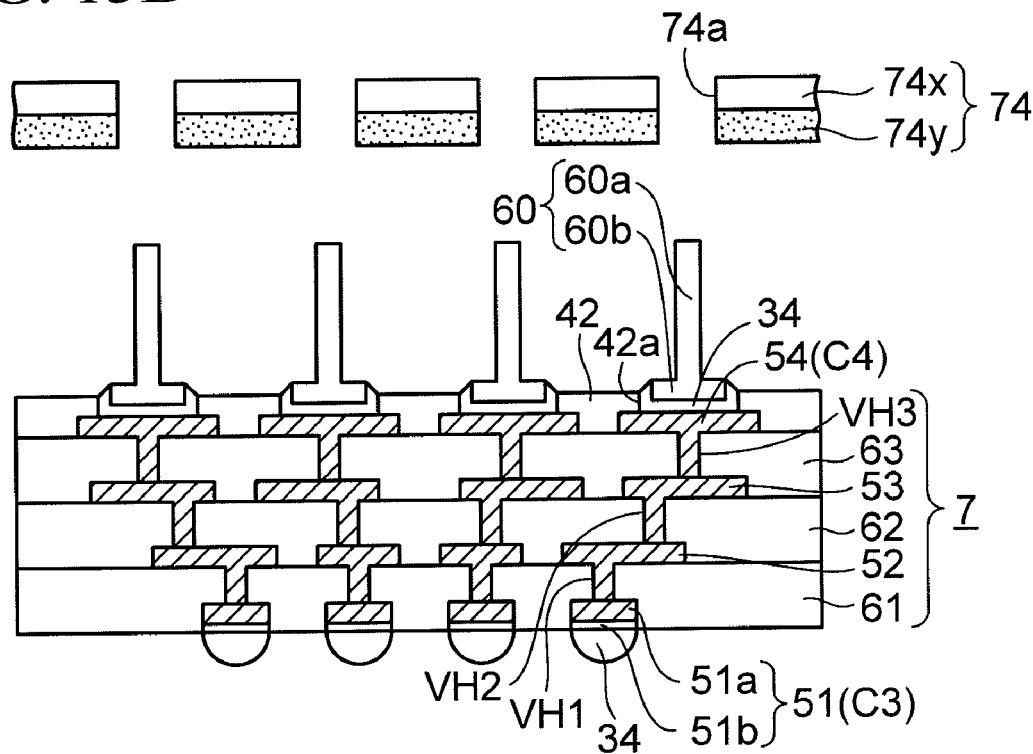

Then, as shown in FIG. 13B, a film with resin 74 constructed by a flame retardant film 74x and an uncured resin layer 74y formed on the lower surface thereof is prepared. The flame retardant film 74x is an example of the insulating film. In the film with resin 74, opening portions 74a are provided in the portion corresponding to the lead pins 60. The opening portions 74a in the film with resin 74 are set larger by one size than a diameter of the lead pin 60 such that a clearance for fluidizing the resin around the lead pin 60 is produced.

As the flame retardant film 74x, an insulating film formed of polyimide film (e.g., product name: Capton: manufactured by Toray-Du Pont Co., Ltd), poly-engineering plastic, polyphenylene sulfide (PPS), resin such as Teflon (registered trademark) such as polytetrafluoroethylene (PTEE), or the like is used. A thickness of the flame retardant film 74x is 5 μm to 200 μm, and a thickness of the resin layer 74y is 100 μm to 300 μm.

As the uncured resin layer 74y, epoxy resin employing an acid anhydride-based or amine-based curing agent, acrylic resin, mixed resin composed of the epoxy resin and the acrylic resin, or the like is used. The uncured resin layer 74y constitutes the projection-shaped resin portion 72 by flowing like the first embodiment, and also functions as an adhesive agent for adhering the flame retardant film 74x.

Figure 14A:
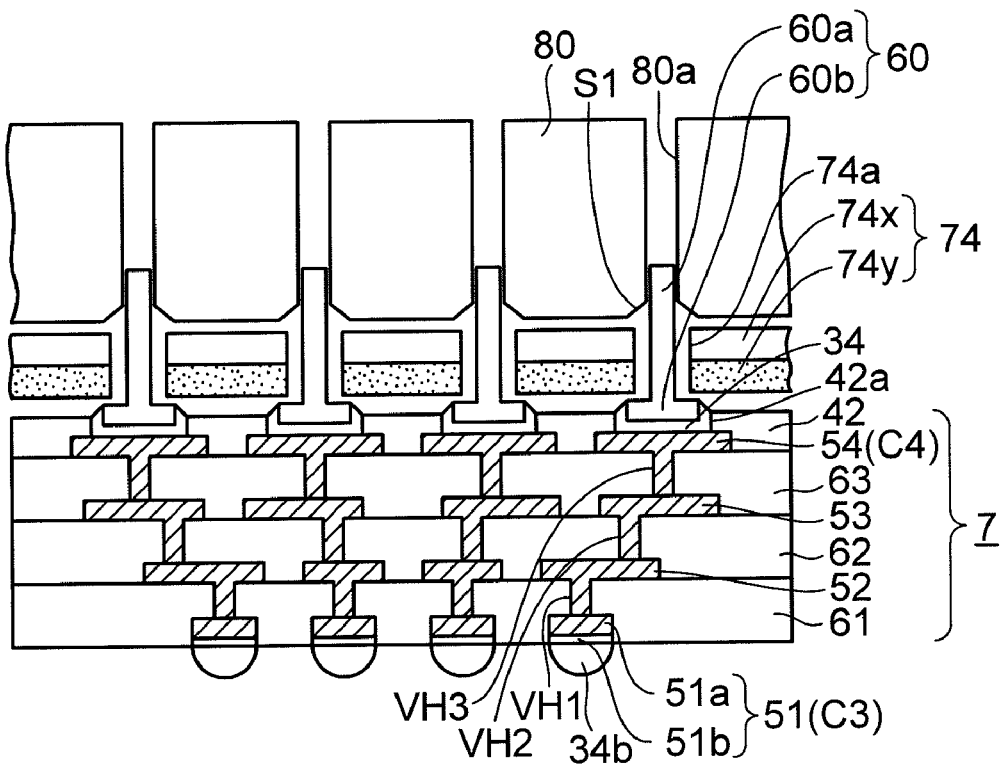
FIGS. 14A and 14B are sectional views (#3) showing the method of manufacturing the semiconductor package according to the second embodiment of the present invention.

Then, as shown in FIG. 13B and FIG. 14A, the coreless wiring substrate 7 in FIG. 13A is reversed up and down. Then, the lead pins 60 of the coreless wiring substrate 7 are inserted into the opening portion 74a of the film with resin 74, and the film with resin 74 is arranged on the coreless wiring substrate 7.

The film with resin 74 is arranged such that the uncured resin layer 74y is directed to the coreless wiring substrate 7 side. Then, similarly to the first embodiment, while pressing the film with resin 74 to the wiring substrate 10 side by the pressing jig 80 in which the opening portions 80a are provided and which has the inclined surfaces S1 on its bottom portion, the film with resin 74 is heat-treated in a temperature atmosphere at 150° C. to 220° C.

Figure 14B:
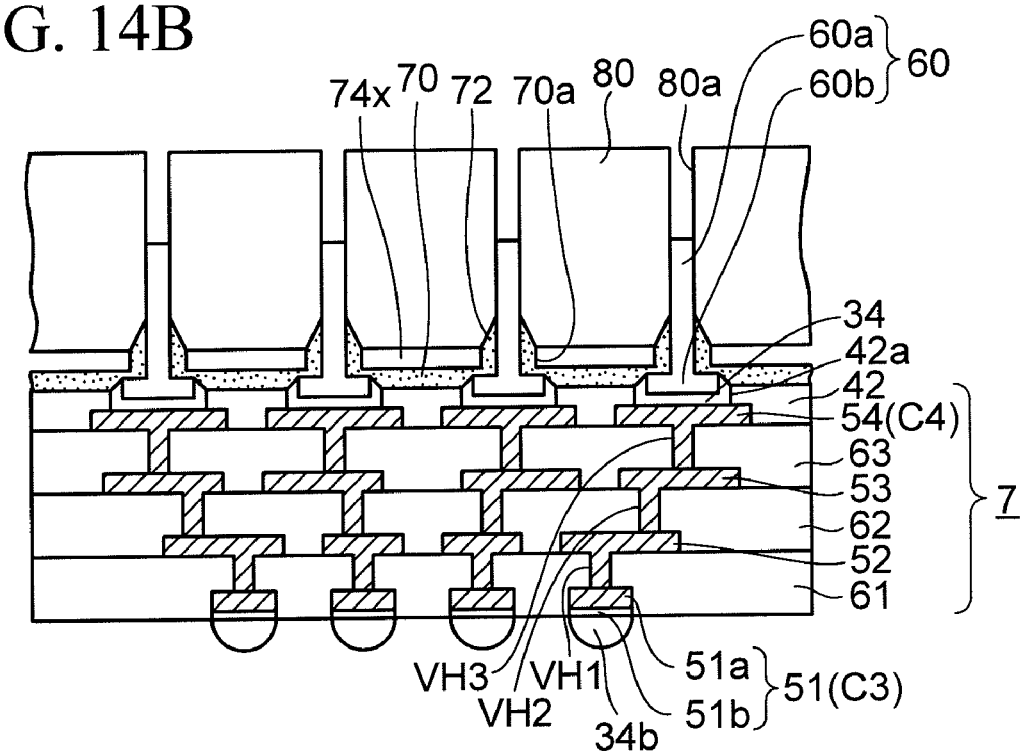

Accordingly, as shown in FIG. 14B, the uncured resin layer 74y is cured, and thus the reinforcing resin layer 70 is formed and also the flame retardant film 74x is adhered onto the coreless wiring substrate 7 by the reinforcing resin layer 70. At this time, the uncured resin layer 74y is pushed upward through the clearances between the lead pins 60 and the opening portions 74a of the flame retardant film 74x by a pressing force from the pressing jig 80 and then is cured. As a result, the projection-shaped resin portions 72 each of which projects locally around the base portion side of the lead pin 60 are formed.

Then, the pressing jig 80 is separated from the coreless wiring substrate 7. With the above, as shown in FIG. 15, a semiconductor package 1a of the second embodiment is obtained.

Figure 15:
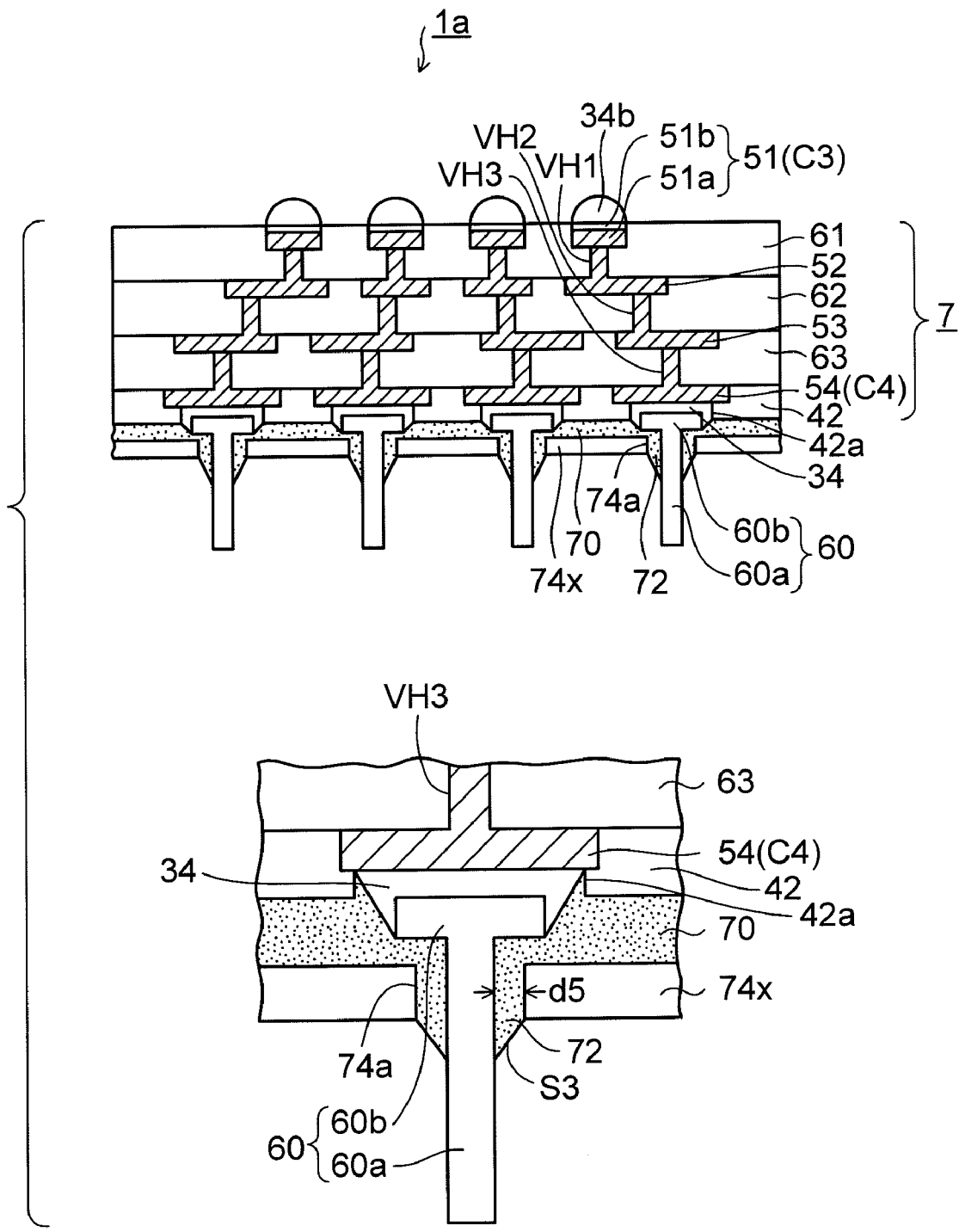
FIG. 15 is a sectional view showing a semiconductor package according to the second embodiment of the present invention.

As shown in FIG. 15, in the semiconductor package 1a of the second embodiment, the coreless wiring substrate 7 in FIG. 12B is reversed up and down and is arranged, and the lead pins 60 are fitted to the connection pads C4 (the fourth wiring layers 54) of the lower surface side by the solder layer 34 to stand upright. The solder material 34b is provided on the connection pads C3 (the first wiring layers 51) on the upper surface side of the coreless wiring substrate 7.

Also, by reference to a fragmental enlarged view in FIG. 15, the reinforcing resin layer 70 is formed on the lower surface side of the coreless wiring substrate 7 so as to wrap around the base portion side of the lead pins 60. Also, the flame retardant film 74x in which the opening portions 74a are provided in the portions corresponding to the lead pins 60 is formed on (in FIG. 15, under) the reinforcing resin layer 70.

A diameter of the opening portion 74a in the flame retardant film 74x is set larger than a diameter of the lead pin 60 by one size. Also, an interval d5 is provided between the opening portion 74a in the flame retardant film 74x and the outer periphery of the lead pin 60.

Then, the projection-shaped resin portion 72 is formed to project toward the top end side of the lead pin 60 from the interval d5 between the lead pin 60 and the opening portion 74a in the flame retardant film 74x. Upon forming the reinforcing resin layer 70 by annealing the uncured resin layer 74y, as described above, the projection-shaped resin portion 72 flows out to the top end side of the lead pin 60 via the interval d5 and is formed as a part of the reinforcing resin layer 70.

In this manner, in the semiconductor package 1a of the second embodiment, the projection-shaped resin portion 72 is formed by causing the resin to fluidize to the top end side of the lead pin 60 through the clearance (the interval d5 in FIG. 15) between the opening portion 74a in the perfectly cured flame retardant film 74x and the outer periphery of the lead pin 60. Therefore, a thickness of the projection-shaped resin portion 72 formed around the lead pin 60 is mainly decided by the interval d5 in FIG. 15. As a result, the projection-shaped resin portions 72 can be shaped uniformly between a large number of lead pins 60.

Also, the resin layer is fluidized while being pushed to the lead pin 60 side through the interval d5 in FIG. 15. Therefore, the projection-shaped resin portions 72 are adhered closely to the base portion side of the lead pins 60 without clearance. Accordingly, the projection-shaped resin portions 72 are formed in a uniform shape with good adhesion at a large number of lead pins 60 respectively. As a result, a mechanical strength of the lead pins 60 can be increased rather than the first embodiment. Also, the crawling-up of the solder can be prevented surely.

Further, the flame retardant film 74x can be adhered easily onto the surface, on which the lead pins 60 of the coreless wiring substrate 7 are provided, by utilizing the reinforcing resin layer 70 as the adhesive layer. Therefore, the semiconductor package having the flame retardancy can be manufactured easily.

Besides, the flame retardant film 74x as well as the reinforcing resin layer 70 is formed on the surface the of the coreless wiring substrate 7, on which the lead pins 60 are provided Therefore, the coreless wiring substrate 7 is reinforced by the reinforcing plate whose thickness is equal to or lower than a thickness of the coreless wiring substrate 7. As a result, a rigidity of the overall substrate can be enhanced by reinforcing the coreless wiring substrate 7 whose rigidity is weak.

Figure 16:
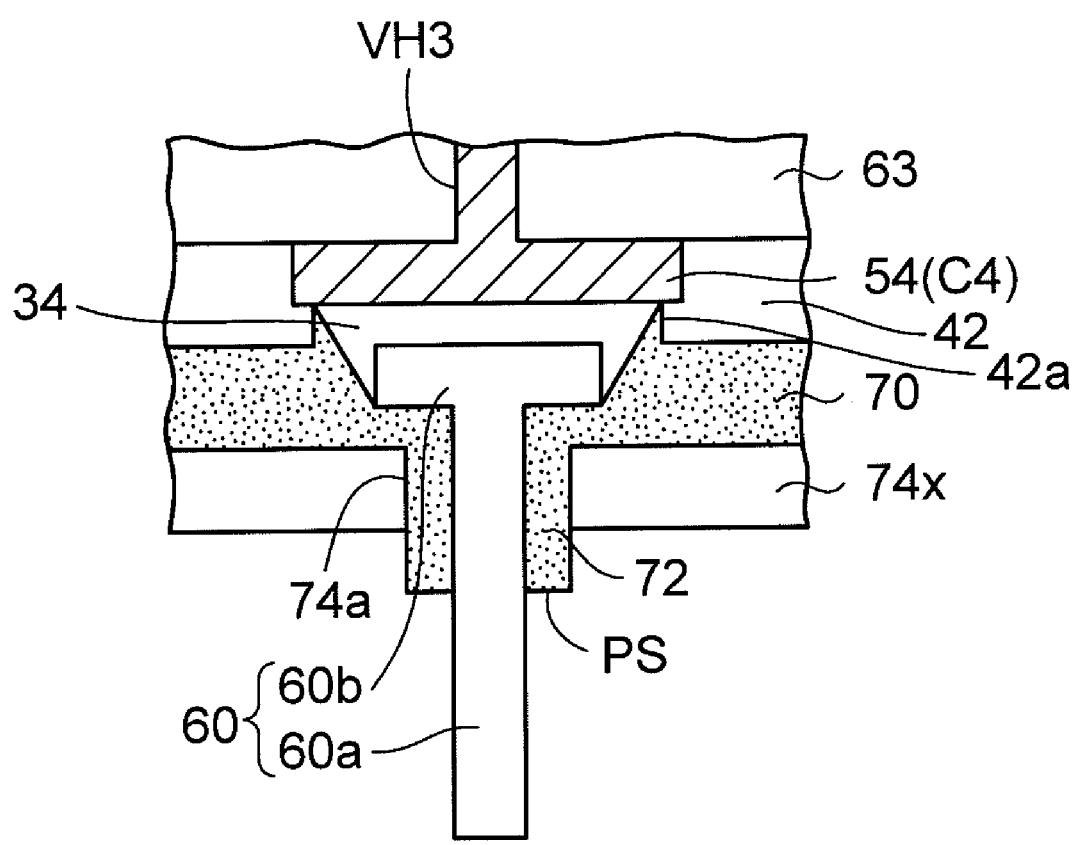
FIG. 16 is a fragmental sectional view showing a surrounding structure of a lead pin in the semiconductor package according to a variation of the second embodiment of the present invention.

In the semiconductor package 1a in FIG. 15, a diameter of the projection-shaped resin portion 72 is narrowed as the position becomes top end side of the lead pin 60, and its top surface constitutes an inclined surface S3. In FIG. 16, the projection-shaped resin portion 72 according to a variation of the second embodiment of the present invention is shown.

As shown in FIG. 16, a diameter of the projection-shaped resin portion 72 may be set identically over the whole of projection direction, and its top surface may constitute a parallel surface PS to the substrate surface of the coreless wiring substrate 7. In this case, instead of the inclined surface S1 of the pressing jig 80 used in FIGS. 14A and 14B, a cutting portion having a right-angled portion to an inside part may be provided such that a shape of the projection-shaped resin portion 72 in FIG. 16 can be obtained.

Figure 17:
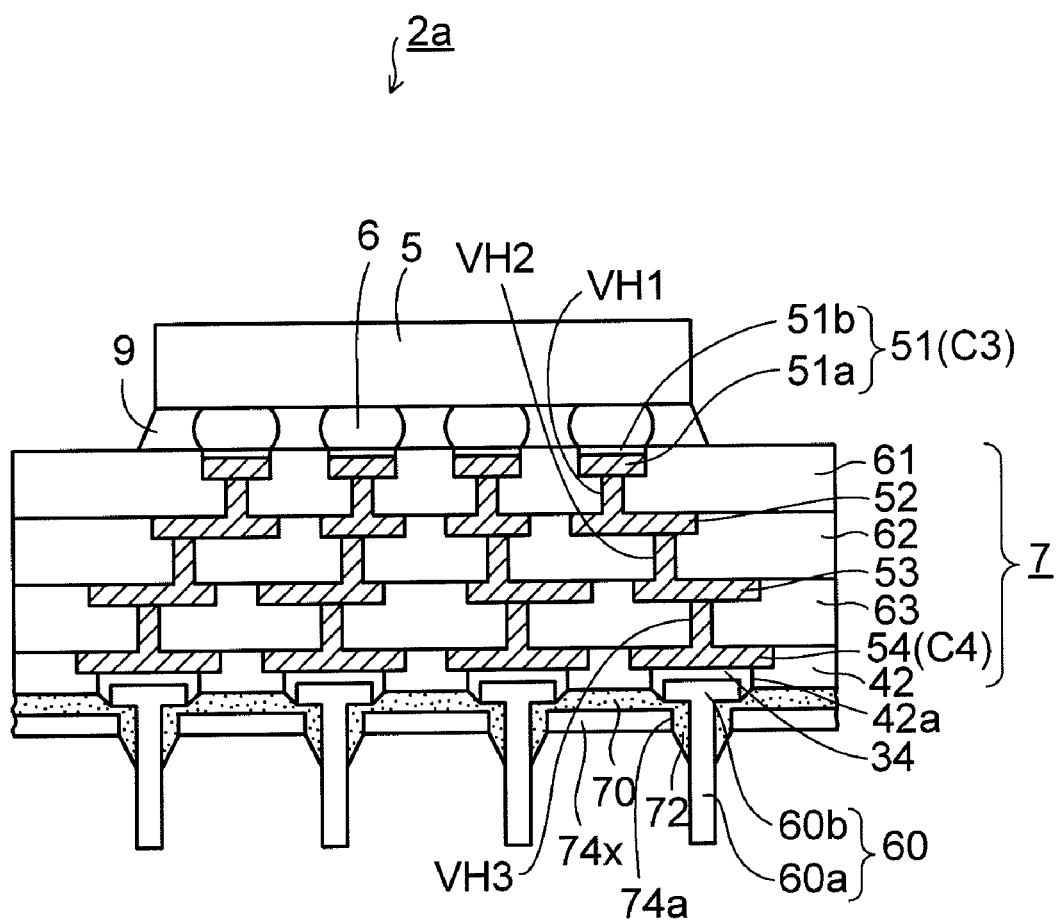
FIG. 17 is a sectional view showing a semiconductor device according to the second embodiment of the present invention.

In FIG. 17, a semiconductor device constructed by mounting a semiconductor chip on the above semiconductor package 1a is illustrated. As shown in FIG. 17, the connection electrodes (the solder electrodes, etc.) of the semiconductor chip 5 (LSI chip) are arranged on the solder materials 34b on the connection pads C3 of the semiconductor package 1a, and the reflow-heating is applied.

Accordingly, the semiconductor chip 5 is flip-chip connected to the connection pads C3 of the wiring substrate 10 by the solder bump 6. Then, the underfill resin 9 is filled into a clearance under the lower surface side of the semiconductor chip 5. In this manner, the semiconductor chip 5 is flip-chip connected to the connection pads C3 on the opposite side to the lead pin 60 side of the semiconductor package 1a, so that a semiconductor device 2a of the second embodiment is obtained.

In the second embodiment, similarly to the first embodiment, even when the solder layer 34 used to fix the lead pin 60 is fused in mounting the semiconductor chip 5, the inclination of the lead pin 60 can be prevented and also the high reliability of the electrical connection of the lead pin 60 can be obtained.

In FIG. 17, the semiconductor chip 5 is mounted on the first wiring layers 51 (the connection pads C3) that appear firstly in forming the build-up wiring layer in the coreless wiring substrate 7, and the lead pins 60 are fitted to the fourth wiring layers 54 (the connection pads C4) that appear lastly.

Figure 18:
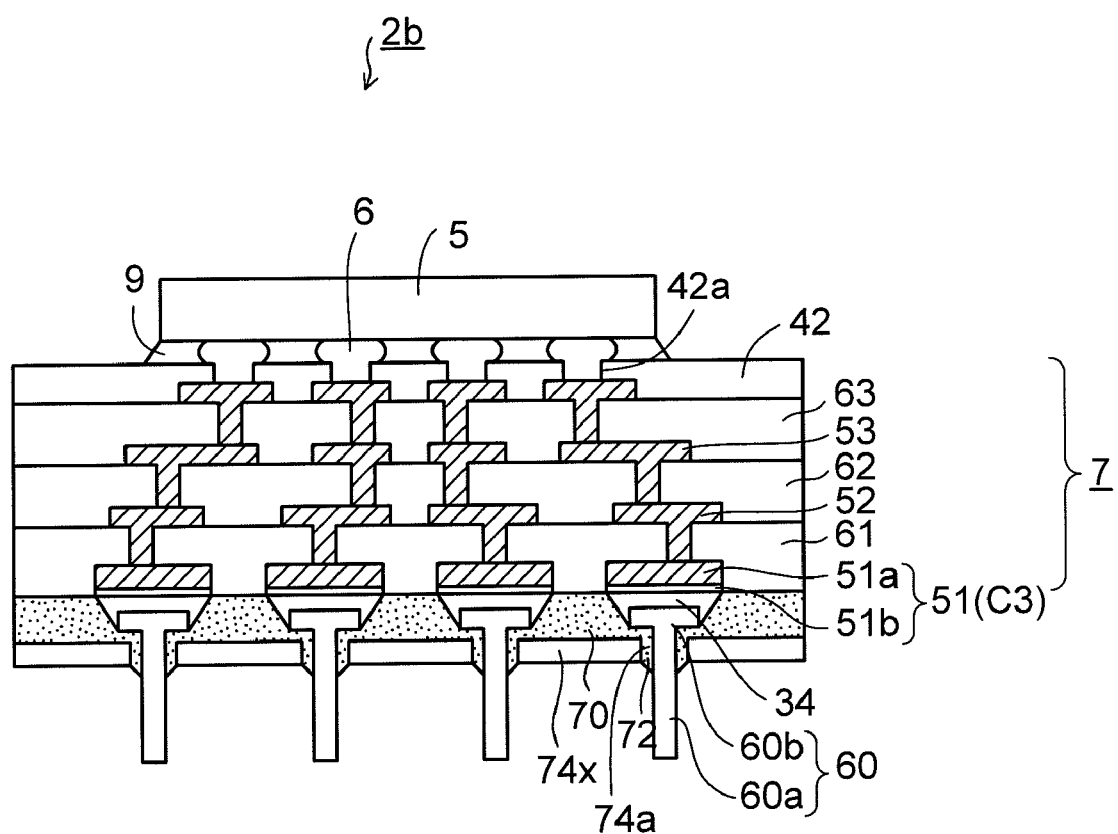
FIG. 18 is a sectional view showing another semiconductor device according to the second embodiment of the present invention.

Like a semiconductor device 2b shown in FIG. 18, conversely the lead pins 60 may be fitted to the first wiring layers 51 (the connection pads C3) that appear firstly in forming the build-up wiring layer in the coreless wiring substrate 7, and the semiconductor chip 5 may be flip-chip connected to the fourth wiring layers 54 (the connection pads C4) that appear lastly.

In the semiconductor devices 2a, 2b in FIG. 17 and FIG. 18, in the coreless wiring substrate 7, the wiring layers are stacked such that a pitch of the wiring layers is narrow as the position becomes the semiconductor chip 5 side (the upper layer side).

Third Embodiment

Figure 19:
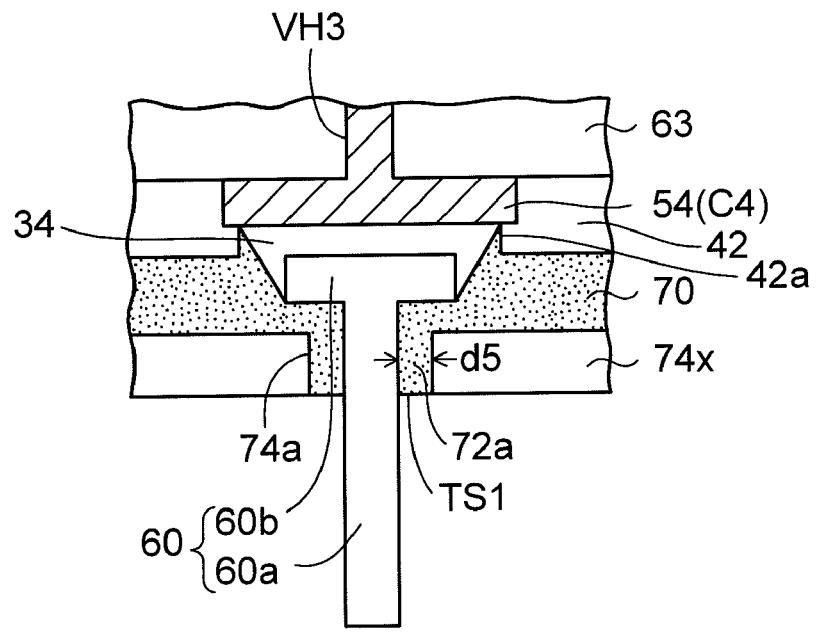
FIG. 19 is a fragmental sectional view (#1) showing a surrounding structure of a lead pin in a semiconductor package according to a third embodiment of the present invention.
Figure 20:
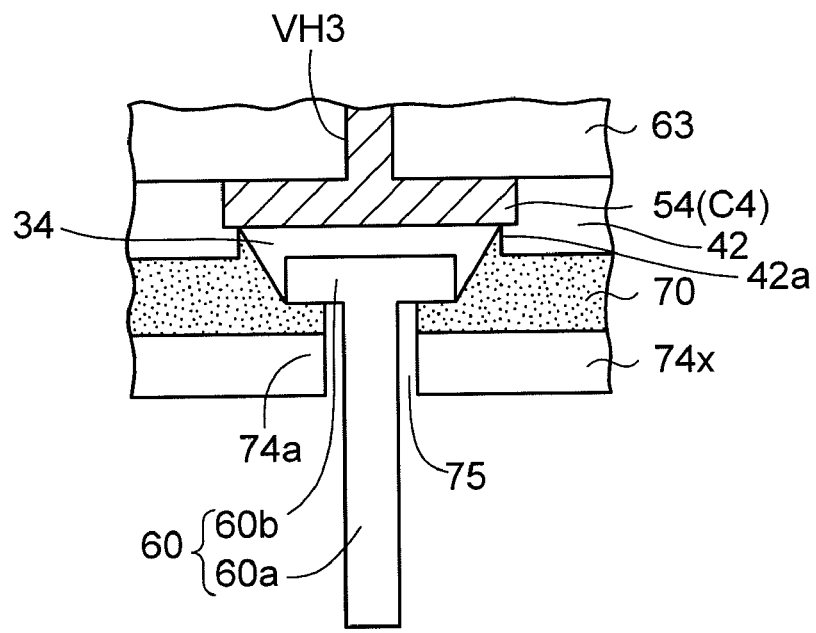
FIG. 20 is a fragmental sectional view (#2) showing the surrounding structure of the lead pin in the semiconductor package according to the third embodiment of the present invention.

FIG. 19 and FIG. 20 are fragmental sectional views showing a surrounding structure of a lead pin in a semiconductor package according to a third embodiment of the present invention. A difference of the third embodiment from the second embodiment resides in a shape of the reinforcing resin layer around the lead pins, and remaining elements are similar to those of the second embodiment and shown in FIG. 15. Therefore, explanation will be made with reference to a fragmental sectional view around the lead pin.

As shown in FIG. 19, in a first example of the third embodiment of the present invention, a filling resin portion 72a of the reinforcing resin layer 70 is filled into the interval d5 between the outer periphery of the lead pin 60 and the side surface of the opening portion 74a in the flame retardant film 74x, and a top surface TS1 (outer surface) of the filling resin portion 72a and the outer surface of the flame retardant film 74x constitute the identical surface (flat surface).

In the case of this mode, in the steps shown in above FIGS. 14A and 14B in the second embodiment, a flowability of the uncured resin layer 74y and a pressing force of the pressing jig 80 are lowered. Thus, the resin flowing through the above interval d5 is adjusted to align with the outer surface of the flame retardant film 74x.

Otherwise, the filling resin portion 72a may be filled in the opening portion 74a in the flame retardant film 74x up to the middle in the thickness direction. That is, the top surface TS1 (outer surface) of the filling resin portion 72a may constitute the identical surface to the outer surface of the flame retardant film 74x or may constitute the surface lower than such outer surface.

Also, as shown in FIG. 20, in a second example of the third embodiment of the present invention, a clearance 75 is provided between the outer periphery of the lead pin 60 and the side surface of the opening portion 74a of the flame retardant film 74x, and the resin is not filled in the clearance 75 to constitute a cavity.

In the case of this mode, in the steps shown in above FIGS. 14A and 14B in the second embodiment, the uncured resin layer 74y whose flowability is considerably low is used, and a pressing force of the pressing jig 80 are lowered as small as possible. Thus, the uncured resin layer 74y positioned under the flame retardant film 74x can be cured in a state that such layer is hardly fluidized. In FIG. 20, the large-diameter portion 60b of the lead pin 60 is reinforced by the reinforcing resin layer 70 and the flame retardant film 74x.

In this manner, in the second and third embodiments, a flowability of the uncured resin layer 74y and a pressing force of the pressing jig 80 are adjusted. Therefore, the reinforcing resin layer 70 that can have various shapes around the lead pin 60 selectively can be obtained.

The third embodiment can achieve the similar advantages to those of the second embodiment.

Fourth Embodiment

Figure 21:
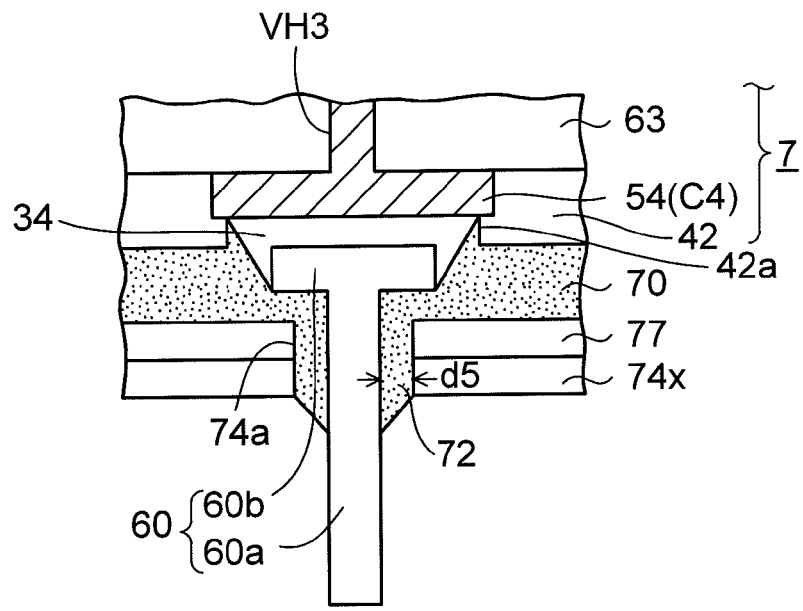
FIG. 21 is a fragmental sectional view (#1) showing a surrounding structure of a lead pin in a semiconductor package according to a fourth embodiment of the present invention.
Figure 22:
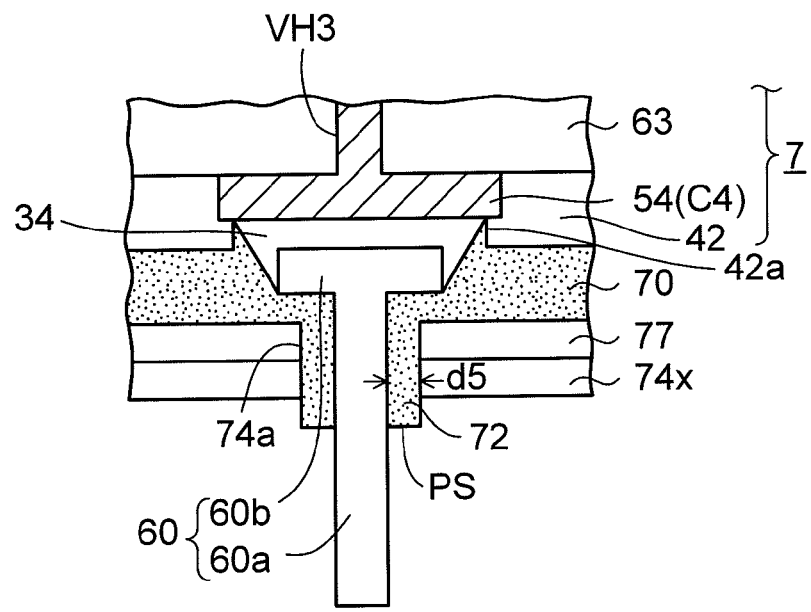
FIG. 22 is a fragmental sectional view (#2) showing the surrounding structure of the lead pin in the semiconductor package according to the fourth embodiment of the present invention.

FIG. 21 and FIG. 22 are fragmental sectional views showing a surrounding structure of a lead pin in a semiconductor package according to a fourth embodiment of the present invention. A difference of the fourth embodiment from the second embodiment resides in that another layer is further formed between the flame retardant film 74x and the reinforcing resin layer 70. Since remaining elements are similar to those of the second embodiment in FIG. 15, explanation will be given with reference to a fragmental sectional view around the lead pin.

As shown in FIG. 21, in the semiconductor package of the fourth embodiment, a middle resin layer 77 is formed between the reinforcing resin layer 70 and the flame retardant film 74x in the semiconductor package 1a of the second embodiment in FIG. 15.

The reinforcing resin layer 70 is filled in from the bottom surface of the coreless wiring substrate 7 to the interval d5 between the opening portion 74a of the flame retardant film 74x and the middle resin layer 77 and the lead pin 60. The projection-shaped resin portion 72 connected to the reinforcing resin layer 70 is formed to project to the top end side of the lead pin 60.

In the fourth embodiment, a coefficient of elasticity is set higher in order of the reinforcing resin layer 70, the middle resin layer 77, and the flame retardant film 74x, which are provided on the outside from the coreless wiring substrate 7 side. For example, an epoxy resin whose coefficient of elasticity is 0.05 to 0.5 GPa is used as the reinforcing resin layer 70, an epoxy resin whose coefficient of elasticity is 1 to 5 GPa is used as the middle resin layer 77, and a polyimide resin whose coefficient of elasticity is about 4.5 GPa is used as the flame retardant film 74x.

The coreless wiring substrate 7 and the flame retardant film 74x as the outermost layer have a different coefficient of thermal expansion respectively. Therefore, a degree of expansion is different between the coreless wiring substrate 7 and the flame retardant film 74x when a heat is applied, and thus a warp of the coreless wiring substrate 7 may be caused.

In the present embodiment, the middle resin layer 77 and the reinforcing resin layer 70, both have a coefficient of elasticity lower than the flame retardant film 74x, are formed between the coreless wiring substrate 7 and the flame retardant film 74x. Therefore, the middle resin layer 77 and the reinforcing resin layer 70 serve as a buffer material between the coreless wiring substrate 7 and the flame retardant film 74x. As a result, it can be prevented that a warp is caused in the coreless wiring substrate 7.

Here, plural layers (two layers or more) of the middle resin layers 77 may be formed between the reinforcing resin layer 70 and the flame retardant film 74x. In this case, also, in from the reinforcing resin layer 70 side to the flame retardant film 74x side, it is preferable that the hard layers whose coefficient of elasticity is set higher sequentially as the position becomes outer layer side should be arranged.

As shown in FIG. 22, similarly to the second embodiment, the top surface of the projection-shaped resin portion 72, which projects from the interval d5 between the opening portion 74a of the flame retardant film 74x and the middle resin layers 77 and the lead pin 60, may be formed as the parallel surface PS to the substrate surface of the coreless wiring substrate 7.

Also, in the fourth embodiment, like the third embodiment in FIG. 19, the reinforcing resin layer 70 may be filled in the opening portion 74a of the flame retardant film 74x and the middle resin layers 77 to constitute the identical surface to the outer surface of the flame retardant film 74x. Thus, the resin may not be project from the outer surface of the flame retardant film 74x.

Also, similarly to the third embodiment in FIG. 20, the resin may not be filled between the opening portion 74a of the flame retardant film 74x and the middle resin layers 77 and the lead pin 60, and a space between them may be kept as a cavity.

Also, in the second and third embodiments, the semiconductor device is constructed by mounting the semiconductor chip on the connection pads on the surface that is opposite to the surface on which the lead pins 60 of the coreless wiring substrate 7 are provided.

What is claimed is:

1. A semiconductor package, comprising:
   a wiring substrate;
   a lead pin fixed by solder to a connection pad on one surface side of the wiring substrate; and
   a reinforcing resin layer connected to a surface of the wiring substrate on which the lead pin is provided, and including a projection-shaped resin portion which projects locally around the lead pin and covers a side surface of a base portion side of the lead pin;
   wherein the projection-shaped resin portion includes a top surface extending outward from an outer peripheral portion of the lead pin, and a side surface constituting a surface non-identical to the top surface.

2. A semiconductor package according to claim 1, wherein the reinforcing resin layer including the projection-shaped resin portion consists of epoxy resin, polyimide resin, acrylic resin, mixed epoxy/acrylic resin, or a two-layered structure of epoxy resin/polyimide resin disposed in the recited order from a bottom adjacent the wiring substrate.

3. A semiconductor package according to claim 1, wherein the solder is lead-free solder.

4. A semiconductor package, comprising:
   a wiring substrate;
   a lead pin fixed by solder to a connection pad on one surface side of the wiring substrate; and
   a reinforcing resin layer connected to a surface of the wiring substrate on which the lead pin is provided, and including a projection-shaped resin portion which projects locally around the lead pin and covers a side surface of a base portion side of the lead pin;
   further comprising: an insulating film disposed on an outer surface side of the reinforcing resin layer and including an opening portion whose diameter is larger than a diameter of the lead pin, and arranged in a state that the lead pin is inserted into the opening portion; wherein the projection-shaped resin portion is filled into a clearance between the lead pin and a side surface of the opening portion in the insulating film, and projects to a top end side of the lead pin; and
   further comprising: a middle resin layer located between the reinforcing resin layer and the insulating film;
   wherein a coefficient of elasticity increases in passing from the reinforcing resin layer to the middle resin layer, and from the middle resin layer to the insulating film.

5. A semiconductor package, comprising:
   a wiring substrate;
   a lead pin fixed by solder to a connection pad on one surface side of the wiring substrate; and
   a reinforcing resin layer connected to a surface of the wiring substrate on which the lead pin is provided, and including a projection-shaped resin portion which projects locally around the lead pin and covers a side surface of a base portion side of the lead pin;
   further comprising: an insulating film disposed on an outer surface side of the reinforcing resin layer and including an opening portion whose diameter is larger than a diameter of the lead pin, and arranged in a state that the lead pin is inserted into the opening portion; wherein the projection-shaped resin portion is filled into a clearance between the lead pin and a side surface of the opening portion in the insulating film, and projects to a top end side of the lead pin; and
   wherein the insulating film consists of any one of polyimide, engineering plastic, polyphenylene sulfide, and polytetrafluoroethylene (PTFE).

6. A semiconductor package, comprising:
a wiring substrate;
a lead pin fixed by solder to a connection pad on one surface side of the wiring substrate; and
a reinforcing resin layer connected to a surface of the wiring substrate on which the lead pin is provided, and covering a side surface of a base portion side of the lead pin;
an insulating film connected to an outer surface side of the reinforcing resin layer to include an opening portion whose diameter is larger than a diameter of the lead pin, and arranged in a state that the lead pin is inserted into the opening portion; and
a filling resin portion filled into a clearance between the lead pin and a side surface of the opening portion in the insulating film in a state that the filling resin portion is connected to the reinforcing resin layer, and covering a side surface of the lead pin;
wherein an outer surface of the filling resin portion constitutes an identical surface to an outer surface of the insulating film or a surface that is lower than the outer surface of the insulating film.

7. A semiconductor package, comprising:
a wiring substrate;
a lead pin fixed by solder to a connection pad on one surface side of the wiring substrate; and
a reinforcing resin layer connected to a surface of the wiring substrate on which the lead pin is provided, including an opening portion whose diameter is larger than a diameter of the lead pin, and arranged in a state that the lead pin is inserted into the opening portion; and
an insulating film connected to an outer surface side of the reinforcing resin layer and including an opening portion whose diameter is larger than a diameter of the lead pin, and arranged in a state that the lead pin is inserted into the opening portion;
wherein a clearance between the lead pin and a side surface of opening portions of the reinforcing resin layer and the insulating film constitutes a cavity.

8. A semiconductor device, comprising: the semiconductor package set forth in claim 1, 2, 3, 4, 5, 6, or 7; and a semiconductor chip mounted on a connection pad on other surface side of the wiring substrate by solder.

9. A semiconductor device according to claim 8, wherein both the solder used to fix the lead pin and the solder used to mount the semiconductor chip are formed of lead-free solder, the semiconductor chip is mounted by reflow-heating the solder, and a melting point of the solder used to fix the lead pin is equal to or lower than a temperature of the reflow-heating applied when the semiconductor chip is mounted.

* * * * *